US011349296B2

(12) United States Patent
Telefus

(10) Patent No.: US 11,349,296 B2
(45) Date of Patent: May 31, 2022

(54) SOLID-STATE CIRCUIT INTERRUPTERS

(71) Applicant: Intelesol LLC, Danville, CA (US)

(72) Inventor: Mark Telefus, Orinda, CA (US)

(73) Assignee: Intelesol, LLC, Danville, CA (US)

(\*) Notice: Subject to any disclaimer, the term of this patent is extended or adjusted under 35 U.S.C. 154(b) by 120 days.

(21) Appl. No.: 16/589,999

(22) Filed: Oct. 1, 2019

(65) Prior Publication Data

US 2020/0106260 A1 Apr. 2, 2020

Related U.S. Application Data

(63) Continuation-in-part of application No. 16/149,094, filed on Oct. 1, 2018, now Pat. No. 10,985,548.

(51) Int. Cl.
*H02H 3/10* (2006.01)
*H03K 17/687* (2006.01)
(Continued)

(52) U.S. Cl.
CPC .............. *H02H 3/105* (2013.01); *H02H 3/10* (2013.01); *H03K 17/687* (2013.01); *H01H 71/04* (2013.01);
(Continued)

(58) Field of Classification Search
CPC ............ H02H 3/10; H02H 3/105; H02H 1/00; H02H 3/08; H02H 1/0007; H03K 17/687;
(Continued)

(56) References Cited

U.S. PATENT DOCUMENTS 3,638,102 A 1/1972 Pelka
3,777,253 A 12/1973 Callan
(Continued)

FOREIGN PATENT DOCUMENTS

CN 109075551 B 1/2021
EP 0016646 A1 10/1980
(Continued)

OTHER PUBLICATIONS

U.S. Appl. No. 17/145,291 filed in the name of Mark Telefus et al. on Jan. 9, 2021, and entitled "Building Automation System.".
(Continued)

*Primary Examiner* — Danny Nguyen
(74) *Attorney, Agent, or Firm* — Ryan, Mason & Lewis, LLP

(57) ABSTRACT

A circuit interrupter includes a solid-state switch and a mode control circuit. The solid-state switch is serially connected between a line input terminal and a load output terminal of the circuit interrupter. The mode control circuit is configured to implement a first control mode and a second control mode to control operation of the circuit interrupter. The first control mode is configured to generate a self-bias turn-on threshold voltage for the solid-state switch during power-up of the circuit interrupter, while maintaining the solid-state switch in a switched-off state until the self-bias turn-on threshold voltage is generated. The second control mode is configured to disrupt the self-bias turn-on threshold voltage and place the solid-state switch into a switched-off state.

20 Claims, 14 Drawing Sheets

(51) Int. Cl.
  *H02H 3/08* (2006.01)
  *H01H 71/12* (2006.01)
  *H03K 17/56* (2006.01)
  *H01H 71/04* (2006.01)
  *H03K 17/94* (2006.01)

(52) U.S. Cl.
  CPC .............. *H01H 71/128* (2013.01); *H02H 3/08* (2013.01); *H03K 17/56* (2013.01); *H03K 17/94* (2013.01)

(58) Field of Classification Search
  CPC ........ H03K 17/94; H03K 17/56; H01H 71/04; H01H 71/24; H01H 71/128
  USPC ........................................................ 361/101
  See application file for complete search history.

(56) References Cited

U.S. PATENT DOCUMENTS

| | | | |
|---|---|---|---|
| 4,074,345 A | 2/1978 | Ackermann |
| 4,127,895 A | 11/1978 | Krueger |
| 4,245,148 A | 1/1981 | Gisske et al. |
| 4,245,184 A | 1/1981 | Billings et al. |
| 4,245,185 A | 1/1981 | Mitchell et al. |
| 4,257,081 A | 3/1981 | Sauer et al. |
| 4,466,071 A | 8/1984 | Russell, Jr. |
| 4,487,458 A | 12/1984 | Janutka |
| 4,581,540 A | 4/1986 | Guajardo |
| 4,631,625 A | 12/1986 | Alexander et al. |
| 4,636,907 A | 1/1987 | Howell |
| 4,649,302 A | 3/1987 | Damiano et al. |
| 4,653,084 A | 3/1987 | Ahuja |
| 4,682,061 A | 7/1987 | Donovan |
| 4,685,046 A | 8/1987 | Sanders |
| 4,709,296 A | 11/1987 | Hung et al. |
| 4,760,293 A | 7/1988 | Hebenstreit |
| 4,766,281 A | 8/1988 | Buhler |
| 4,812,995 A | 3/1989 | Girgis et al. |
| 4,888,504 A | 12/1989 | Kinzer |
| 5,121,282 A | 6/1992 | White |
| 5,276,737 A | 1/1994 | Micali |
| 5,307,257 A | 4/1994 | Fukushima |
| 5,371,646 A | 12/1994 | Biegelmeier |
| 5,410,745 A | 4/1995 | Friesen et al. |
| 5,559,656 A | 9/1996 | Chokhawala |
| 5,646,514 A | 7/1997 | Tsunetsugu |
| 5,654,880 A | 8/1997 | Brkovic et al. |
| 5,731,732 A | 3/1998 | Williams |
| 5,793,596 A | 8/1998 | Jordan et al. |
| 5,796,274 A | 8/1998 | Willis et al. |
| 5,844,759 A * | 12/1998 | Hirsh .................. H02H 11/005 361/42 |
| 5,870,009 A | 2/1999 | Serpinet et al. |
| 5,933,305 A | 8/1999 | Schmalz et al. |
| 6,081,123 A | 6/2000 | Kasbarian et al. |
| 6,111,494 A | 8/2000 | Fischer et al. |
| 6,115,267 A | 9/2000 | Herbert |
| 6,141,197 A | 10/2000 | Kim et al. |
| 6,160,689 A | 12/2000 | Stolzenberg |
| 6,167,329 A | 12/2000 | Engel et al. |
| 6,169,391 B1 | 1/2001 | Lei |
| 6,188,203 B1 | 2/2001 | Rice et al. |
| 6,300,748 B1 | 10/2001 | Miller |
| 6,369,554 B1 | 4/2002 | Aram |
| 6,483,290 B1 | 11/2002 | Hemminger et al. |
| 6,515,434 B1 | 2/2003 | Biebl |
| 6,538,906 B1 | 3/2003 | Ke et al. |
| 6,756,998 B1 | 6/2004 | Bilger |
| 6,788,512 B2 | 9/2004 | Vicente et al. |
| 6,813,720 B2 | 11/2004 | Leblanc |
| 6,839,208 B2 | 1/2005 | Macbeth et al. |
| 6,843,680 B2 | 1/2005 | Gorman |
| 6,906,476 B1 | 6/2005 | Beatenbough et al. |
| 6,984,988 B2 | 1/2006 | Yamamoto |
| 7,045,723 B1 | 5/2006 | Projkovski |
| 7,053,626 B2 | 5/2006 | Monter et al. |
| 7,110,225 B1 | 9/2006 | Hick |
| 7,164,238 B2 | 1/2007 | Kazanov et al. |
| 7,297,603 B2 | 11/2007 | Robb et al. |
| 7,304,828 B1 | 12/2007 | Shvartsman |
| D558,683 S | 1/2008 | Pape et al. |
| 7,319,574 B2 | 1/2008 | Engel |
| D568,253 S | 5/2008 | Gorman |
| 7,367,121 B1 | 5/2008 | Gorman |
| 7,586,285 B2 | 9/2009 | Gunji |
| 7,595,680 B2 | 9/2009 | Morita et al. |
| 7,610,616 B2 | 10/2009 | Masuouka et al. |
| 7,633,727 B2 | 12/2009 | Zhou et al. |
| 7,643,256 B2 | 1/2010 | Wright et al. |
| 7,693,670 B2 | 4/2010 | Durling et al. |
| 7,715,216 B2 | 5/2010 | Liu et al. |
| 7,729,147 B1 | 6/2010 | Wong et al. |
| 7,731,403 B2 | 6/2010 | Lynam et al. |
| 7,746,677 B2 | 6/2010 | Unkrich |
| 7,821,023 B2 | 10/2010 | Yuan et al. |
| D638,355 S | 5/2011 | Chen |
| 7,936,279 B2 | 5/2011 | Tang et al. |
| 7,948,719 B2 | 5/2011 | Xu |
| 8,124,888 B2 | 2/2012 | Etemad-Moghadam et al. |
| 8,256,675 B2 | 9/2012 | Baglin et al. |
| 8,374,729 B2 | 2/2013 | Chapel et al. |
| 8,463,453 B2 | 6/2013 | Parsons, Jr. |
| 8,482,885 B2 | 7/2013 | Billingsley et al. |
| 8,560,134 B1 | 10/2013 | Lee |
| 8,649,883 B2 | 2/2014 | Lu et al. |
| 8,664,886 B2 | 3/2014 | Ostrovsky |
| 8,717,720 B2 | 5/2014 | DeBoer |
| 8,718,830 B2 | 5/2014 | Smith |
| 8,781,637 B2 | 7/2014 | Eaves |
| 8,817,441 B2 | 8/2014 | Callanan |
| 8,890,371 B2 | 11/2014 | Gotou |
| D720,295 S | 12/2014 | Dodal et al. |
| 8,947,838 B2 | 2/2015 | Yamai et al. |
| 9,054,587 B2 | 6/2015 | Neyman |
| 9,055,641 B2 | 6/2015 | Shteynberg et al. |
| 9,287,792 B2 | 3/2016 | Telefus et al. |
| 9,325,516 B2 | 4/2016 | Pera et al. |
| 9,366,702 B2 | 6/2016 | Steele et al. |
| 9,439,318 B2 | 9/2016 | Chen |
| 9,443,845 B1 | 9/2016 | Stafanov et al. |
| 9,502,832 B1 | 11/2016 | Ullahkhan et al. |
| 9,509,083 B2 | 11/2016 | Yang |
| 9,515,560 B1 | 12/2016 | Telefus et al. |
| 9,577,420 B2 | 2/2017 | Ostrovsky et al. |
| 9,621,053 B1 | 4/2017 | Telefus |
| 9,774,182 B2 | 9/2017 | Phillips |
| 9,775,182 B2 | 9/2017 | Phillips |
| 9,836,243 B1 | 12/2017 | Chanler et al. |
| D814,424 S | 4/2018 | DeCosta |
| 9,965,007 B2 | 5/2018 | Amelio et al. |
| 9,990,786 B1 | 6/2018 | Ziraknejad |
| 9,991,633 B1 | 6/2018 | Robinet |
| 10,072,942 B2 | 9/2018 | Wootton et al. |
| 10,101,716 B2 | 10/2018 | Kim |
| 10,187,944 B2 | 1/2019 | MacAdam et al. |
| 10,469,077 B2 | 11/2019 | Telefus et al. |
| D879,056 S | 3/2020 | Telefus |
| D881,144 S | 4/2020 | Telefus |
| 10,615,713 B2 | 4/2020 | Telefus et al. |
| 10,645,536 B1 | 5/2020 | Barnes et al. |
| 10,756,662 B2 | 8/2020 | Steiner et al. |
| 10,812,072 B2 | 10/2020 | Telefus et al. |
| 10,812,282 B2 | 10/2020 | Telefus et al. |
| 10,819,336 B2 | 10/2020 | Telefus et al. |
| 10,834,792 B2 | 11/2020 | Telefus et al. |
| 10,887,447 B2 | 1/2021 | Jakobsson et al. |
| 10,936,749 B2 | 3/2021 | Jakobsson |
| 10,951,435 B2 | 3/2021 | Jakobsson |
| 10,985,548 B2 | 4/2021 | Telefus |
| 10,992,236 B2 | 4/2021 | Telefus et al. |
| 10,993,082 B2 | 4/2021 | Jakobsson |
| 2002/0109487 A1 | 8/2002 | Telefus et al. |
| 2003/0052544 A1 | 3/2003 | Yamamoto et al. |

(56) References Cited

U.S. PATENT DOCUMENTS

| | | |
|---|---|---|
| 2003/0063420 A1 | 4/2003 | Pahl et al. |
| 2003/0151865 A1 | 8/2003 | Maio |
| 2004/0032756 A1 | 2/2004 | Van Den Bossche |
| 2004/0251884 A1 | 12/2004 | Steffie et al. |
| 2005/0162139 A1 | 7/2005 | Hirst |
| 2005/0185353 A1 | 8/2005 | Rasmussen et al. |
| 2005/0286184 A1 | 12/2005 | Campolo |
| 2006/0285366 A1 | 12/2006 | Radecker et al. |
| 2007/0008747 A1 | 1/2007 | Soldano et al. |
| 2007/0143826 A1 | 6/2007 | Sastry et al. |
| 2007/0159745 A1 | 7/2007 | Berberich et al. |
| 2007/0188025 A1 | 8/2007 | Keagy et al. |
| 2007/0217237 A1* | 9/2007 | Salvestrini ............ H05B 39/08 363/125 |
| 2007/0236152 A1 | 10/2007 | Davis et al. |
| 2008/0006607 A1 | 1/2008 | Boeder et al. |
| 2008/0136581 A1 | 6/2008 | Heilman et al. |
| 2008/0151444 A1 | 6/2008 | Upton |
| 2008/0174922 A1 | 7/2008 | Kimbrough |
| 2008/0180866 A1 | 7/2008 | Wong |
| 2008/0204950 A1 | 8/2008 | Zhou et al. |
| 2008/0253153 A1 | 10/2008 | Wu et al. |
| 2008/0281472 A1 | 11/2008 | Podgorny et al. |
| 2009/0034139 A1 | 2/2009 | Martin |
| 2009/0067201 A1 | 3/2009 | Cai |
| 2009/0168273 A1 | 7/2009 | Yu et al. |
| 2009/0195349 A1 | 8/2009 | Frader-Thompson et al. |
| 2009/0203355 A1 | 8/2009 | Clark |
| 2009/0213629 A1 | 8/2009 | Liu et al. |
| 2009/0284385 A1 | 11/2009 | Tang et al. |
| 2010/0091418 A1 | 4/2010 | Xu |
| 2010/0145479 A1 | 6/2010 | Griffiths |
| 2010/0145542 A1 | 6/2010 | Chapel et al. |
| 2010/0156369 A1 | 6/2010 | Kularatna et al. |
| 2010/0188054 A1 | 7/2010 | Asakura et al. |
| 2010/0231135 A1 | 9/2010 | Hum et al. |
| 2010/0231373 A1 | 9/2010 | Romp |
| 2010/0244730 A1 | 9/2010 | Nerone |
| 2010/0261373 A1 | 10/2010 | Roneker |
| 2010/0284207 A1 | 11/2010 | Watanabe et al. |
| 2010/0296207 A1 | 11/2010 | Schumacher et al. |
| 2010/0320840 A1 | 12/2010 | Fridberg |
| 2011/0062936 A1 | 3/2011 | Bartelous |
| 2011/0121752 A1 | 5/2011 | Newman, Jr. et al. |
| 2011/0127922 A1 | 6/2011 | Sauerlaender |
| 2011/0156610 A1 | 6/2011 | Ostrovsky et al. |
| 2011/0273103 A1 | 11/2011 | Hong |
| 2011/0292703 A1 | 12/2011 | Cuk |
| 2011/0299547 A1 | 12/2011 | Diab et al. |
| 2011/0301894 A1 | 12/2011 | Sanderford, Jr. |
| 2011/0305054 A1 | 12/2011 | Yamagiwa et al. |
| 2011/0307447 A1 | 12/2011 | Sabaa et al. |
| 2012/0026632 A1 | 2/2012 | Acharya et al. |
| 2012/0075897 A1 | 3/2012 | Fujita |
| 2012/0089266 A1 | 4/2012 | Tomimbang et al. |
| 2012/0095605 A1 | 4/2012 | Tran |
| 2012/0133289 A1 | 5/2012 | Hum et al. |
| 2012/0275076 A1 | 11/2012 | Shono |
| 2012/0311035 A1 | 12/2012 | Guha et al. |
| 2013/0051102 A1 | 2/2013 | Huang et al. |
| 2013/0057247 A1 | 3/2013 | Russell et al. |
| 2013/0063851 A1 | 3/2013 | Stevens et al. |
| 2013/0066478 A1 | 3/2013 | Smith |
| 2013/0128396 A1 | 3/2013 | Stevens et al. |
| 2013/0088160 A1 | 4/2013 | Chai et al. |
| 2013/0119958 A1 | 5/2013 | Gasperi |
| 2013/0170261 A1 | 7/2013 | Lee et al. |
| 2013/0174211 A1 | 7/2013 | Aad et al. |
| 2013/0245841 A1 | 9/2013 | Ahn et al. |
| 2013/0253898 A1 | 9/2013 | Meagher et al. |
| 2013/0261821 A1 | 10/2013 | Lu et al. |
| 2013/0300534 A1 | 11/2013 | Myllymaki |
| 2013/0329331 A1 | 12/2013 | Erger et al. |
| 2014/0043732 A1 | 2/2014 | McKay et al. |
| 2014/0067137 A1 | 3/2014 | Amelio et al. |
| 2014/0074730 A1 | 3/2014 | Arensmeier et al. |
| 2014/0085940 A1 | 3/2014 | Lee et al. |
| 2014/0096272 A1 | 4/2014 | Makofsky et al. |
| 2014/0097809 A1 | 4/2014 | Follic et al. |
| 2014/0159593 A1 | 6/2014 | Chu et al. |
| 2014/0203718 A1 | 7/2014 | Yoon et al. |
| 2014/0246926 A1 | 9/2014 | Cruz et al. |
| 2014/0266698 A1 | 9/2014 | Hall et al. |
| 2014/0268935 A1 | 9/2014 | Chiang |
| 2014/0276753 A1 | 9/2014 | Wham et al. |
| 2015/0042274 A1 | 2/2015 | Kim et al. |
| 2015/0055261 A1 | 2/2015 | Lubick et al. |
| 2015/0097430 A1 | 4/2015 | Scruggs |
| 2015/0116886 A1 | 4/2015 | Zehnder et al. |
| 2015/0154404 A1 | 6/2015 | Patel et al. |
| 2015/0155789 A1 | 6/2015 | Freeman et al. |
| 2015/0180469 A1 | 6/2015 | Kim |
| 2015/0185261 A1 | 7/2015 | Frader-Thompson et al. |
| 2015/0216006 A1 | 7/2015 | Lee et al. |
| 2015/0236587 A1 | 8/2015 | Kim et al. |
| 2015/0253364 A1 | 9/2015 | Hieda et al. |
| 2015/0256355 A1 | 9/2015 | Pera et al. |
| 2015/0256665 A1 | 9/2015 | Pera et al. |
| 2015/0282223 A1 | 10/2015 | Wang et al. |
| 2015/0309521 A1 | 10/2015 | Pan |
| 2015/0317326 A1 | 11/2015 | Bandarupalli et al. |
| 2015/0355649 A1 | 12/2015 | Ovadia |
| 2015/0362927 A1 | 12/2015 | Giorgi |
| 2016/0012699 A1 | 1/2016 | Lundy |
| 2016/0018800 A1 | 1/2016 | Gettings et al. |
| 2016/0035159 A1 | 2/2016 | Ganapathy Achari et al. |
| 2016/0057841 A1 | 2/2016 | Lenig |
| 2016/0069933 A1 | 3/2016 | Cook et al. |
| 2016/0077746 A1 | 3/2016 | Muth et al. |
| 2016/0081143 A1 | 3/2016 | Wang |
| 2016/0110154 A1 | 4/2016 | Qureshi et al. |
| 2016/0117917 A1 | 4/2016 | Prakash et al. |
| 2016/0126031 A1 | 5/2016 | Wootton et al. |
| 2016/0178691 A1 | 6/2016 | Simonin |
| 2016/0181941 A1 | 6/2016 | Gratton et al. |
| 2016/0195864 A1 | 7/2016 | Kim |
| 2016/0247799 A1 | 8/2016 | Stafanov et al. |
| 2016/0259308 A1 | 9/2016 | Fadell et al. |
| 2016/0260135 A1 | 9/2016 | Zomet et al. |
| 2016/0277528 A1 | 9/2016 | Guilaume et al. |
| 2016/0294179 A1 | 10/2016 | Kennedy et al. |
| 2016/0343083 A1 | 11/2016 | Hering et al. |
| 2016/0360586 A1 | 12/2016 | Yang et al. |
| 2016/0374134 A1 | 12/2016 | Kweon et al. |
| 2017/0004948 A1 | 1/2017 | Leyh |
| 2017/0019969 A1 | 1/2017 | O'Neil et al. |
| 2017/0026194 A1 | 1/2017 | Vijayrao et al. |
| 2017/0033942 A1 | 2/2017 | Koeninger |
| 2017/0063225 A1 | 3/2017 | Guo et al. |
| 2017/0086281 A1 | 3/2017 | Avrahamy |
| 2017/0099647 A1 | 4/2017 | Shah et al. |
| 2017/0170730 A1 | 6/2017 | Sugiura |
| 2017/0171802 A1 | 6/2017 | Hou et al. |
| 2017/0179946 A1 | 6/2017 | Turvey |
| 2017/0195130 A1 | 7/2017 | Landow et al. |
| 2017/0212653 A1 | 7/2017 | Kanojia et al. |
| 2017/0230193 A1 | 8/2017 | Apte et al. |
| 2017/0244241 A1 | 8/2017 | Wilson et al. |
| 2017/0256934 A1 | 9/2017 | Kennedy et al. |
| 2017/0256941 A1 | 9/2017 | Bowers et al. |
| 2017/0256956 A1 | 9/2017 | Irish et al. |
| 2017/0277709 A1 | 9/2017 | Strauss et al. |
| 2017/0314743 A1 | 11/2017 | Del Castillo et al. |
| 2017/0322049 A1 | 11/2017 | Wootton et al. |
| 2017/0322258 A1 | 11/2017 | Miller et al. |
| 2017/0338809 A1 | 11/2017 | Stefanov et al. |
| 2017/0347415 A1 | 11/2017 | Cho et al. |
| 2017/0366950 A1 | 12/2017 | Abron |
| 2018/0026534 A1 | 1/2018 | Turcan |
| 2018/0054862 A1 | 2/2018 | Takagimoto et al. |
| 2018/0061158 A1 | 3/2018 | Greene |
| 2018/0146369 A1 | 5/2018 | Kennedy, Jr. |
| 2018/0174076 A1 | 6/2018 | Fukami |
| 2018/0196094 A1 | 7/2018 | Fishburn et al. |

(56) References Cited

U.S. PATENT DOCUMENTS

| | | |
|---|---|---|
| 2018/0201302 A1 | 7/2018 | Sonoda et al. |
| 2018/0254959 A1 | 9/2018 | Mantyjarvi et al. |
| 2018/0285198 A1 | 10/2018 | Dantkale et al. |
| 2018/0287802 A1 | 10/2018 | Brickell |
| 2018/0301006 A1 | 10/2018 | Flint et al. |
| 2018/0307609 A1 | 10/2018 | Qiang et al. |
| 2018/0342329 A1 | 11/2018 | Rufo et al. |
| 2018/0359039 A1 | 12/2018 | Daoura et al. |
| 2018/0359223 A1 | 12/2018 | Maier et al. |
| 2019/0003855 A1 | 1/2019 | Wootton et al. |
| 2019/0020477 A1 | 1/2019 | Antonatos et al. |
| 2019/0028869 A1 | 1/2019 | Kaliner |
| 2019/0036928 A1 | 1/2019 | Meriac et al. |
| 2019/0050903 A1 | 2/2019 | DeWitt et al. |
| 2019/0052174 A1 | 2/2019 | Gong |
| 2019/0068716 A1 | 2/2019 | Lauer |
| 2019/0086979 A1 | 3/2019 | Kao et al. |
| 2019/0087835 A1 | 3/2019 | Schwed et al. |
| 2019/0104138 A1 | 4/2019 | Storms et al. |
| 2019/0122834 A1 | 4/2019 | Wootton et al. |
| 2019/0140640 A1 | 5/2019 | Telefus et al. |
| 2019/0165691 A1 | 5/2019 | Telefus et al. |
| 2019/0207375 A1 | 7/2019 | Telefus et al. |
| 2019/0238060 A1 | 8/2019 | Telefus et al. |
| 2019/0245457 A1 | 8/2019 | Telefus et al. |
| 2019/0253243 A1 | 8/2019 | Zimmerman et al. |
| 2019/0268176 A1 | 8/2019 | Pognant |
| 2019/0280887 A1 | 9/2019 | Telefus et al. |
| 2019/0306953 A1 | 10/2019 | Joyce et al. |
| 2019/0334999 A1 | 10/2019 | Ryhorchuk et al. |
| 2019/0355014 A1 | 11/2019 | Gerber |
| 2019/0372331 A1 | 12/2019 | Liu et al. |
| 2020/0007126 A1 | 1/2020 | Telefus et al. |
| 2020/0014301 A1 | 1/2020 | Telefus |
| 2020/0014379 A1 | 1/2020 | Telefus |
| 2020/0044883 A1 | 2/2020 | Telefus et al. |
| 2020/0052607 A1 | 2/2020 | Telefus et al. |
| 2020/0053100 A1 | 2/2020 | Jakobsson |
| 2020/0106637 A1 | 4/2020 | Jakobsson |
| 2020/0120202 A1 | 4/2020 | Jakobsson et al. |
| 2020/0145247 A1 | 5/2020 | Jakobsson |
| 2020/0153245 A1 | 5/2020 | Jakobsson et al. |
| 2020/0159960 A1 | 5/2020 | Jakobsson |
| 2020/0193785 A1 | 6/2020 | Berglund et al. |
| 2020/0196110 A1 | 6/2020 | Jakobsson |
| 2020/0196412 A1 | 6/2020 | Telefus et al. |
| 2020/0260287 A1 | 8/2020 | Hendel |
| 2020/0275266 A1 | 8/2020 | Jakobsson |
| 2020/0287537 A1 | 9/2020 | Telefus et al. |
| 2020/0314233 A1 | 10/2020 | Mohalik et al. |
| 2020/0328694 A1 | 10/2020 | Telefus et al. |
| 2020/0344596 A1 | 10/2020 | Dong et al. |
| 2020/0365345 A1 | 11/2020 | Telefus et al. |
| 2020/0365346 A1 | 11/2020 | Telefus et al. |
| 2020/0365356 A1 | 11/2020 | Telefus et al. |
| 2020/0366078 A1 | 11/2020 | Telefus et al. |
| 2020/0366079 A1 | 11/2020 | Telefus et al. |
| 2020/0394332 A1 | 12/2020 | Jakobsson et al. |
| 2021/0014947 A1 | 1/2021 | Telefus et al. |
| 2021/0119528 A1 | 4/2021 | Telefus |

FOREIGN PATENT DOCUMENTS

| | | |
|---|---|---|
| EP | 0398026 A2 | 11/1990 |
| EP | 2560063 A1 | 2/2013 |
| GB | 2458699 A | 9/2009 |
| JP | 06-053779 A | 2/1994 |
| JP | 2013230034 A | 11/2013 |
| JP | 2014030355 A | 2/2014 |
| WO | 2010110951 A1 | 9/2010 |
| WO | 2016010529 A1 | 1/2016 |
| WO | 2016110833 A2 | 7/2016 |
| WO | 2017196571 A1 | 11/2017 |
| WO | 2017196572 A1 | 11/2017 |
| WO | 2017196649 A1 | 11/2017 |
| WO | 2018075726 A1 | 4/2018 |
| WO | 2018080604 A1 | 5/2018 |
| WO | 2018080614 A1 | 5/2018 |
| WO | 2018081619 A2 | 5/2018 |
| WO | 2018081619 A3 | 5/2018 |
| WO | 2019133110 A1 | 4/2019 |
| WO | 2020014158 A1 | 1/2020 |
| WO | 2020014161 A1 | 1/2020 |
| WO | PCT/US19/54102 | 2/2020 |
| WO | 2020072516 A1 | 4/2020 |
| WO | PCT/US19/67004 | 4/2020 |
| WO | 2020131977 A1 | 6/2020 |
| WO | PCT/US20/33421 | 9/2020 |
| WO | 2020236726 A1 | 11/2020 |
| WO | PCT/US21/14320 | 4/2021 |

OTHER PUBLICATIONS

U.S. Appl. No. 17/153,280 filed in the name of Bjorn Markus Jakobsson on Jan. 20, 2021, and entitled "Infrastructure Support to Enhance Resource-Constrained Device Capabilities.".

U.S. Appl. No. 17/154,625 filed in the name of Mark Telefus et al. on Jan. 21, 2021, and entitled "Intelligent Circuit Interruption.".

S. Jerde, "The New York Times Can Now Predict Your Emotions and Motivations After Reading a Story," https://www.adweek.com/tv-video/the-new-york-times-can-now-predict-your-emotions-and-motivations-after-reading-a-story/, Apr. 29, 2019, 3 pages.

K. Mowery et al., "Pixel Perfect: Fingerprinting Canvas in HTML5," Proceedings of W2SP, 2012, 12 pages.

S. Kamkar, "Evercookie," https://samy.pl/evercookie/, Oct. 11, 2010, 5 pages.

M. K. Franklin et al., "Fair Exchange with a Semi-Trusted Third Party," Association for Computing Machinery, 1997, 6 pages.

J. Camenisch et al., "Digital Payment Systems with Passive Anonymity-Revoking Trustees," Journal of Computer Security, vol. 5, No. 1, 1997, 11 pages.

L. Coney et al., "Towards a Privacy Measurement Criterion for Voting Systems," Proceedings of the 2005 National Conference On Digital Government Research, 2005, 2 pages.

L. Sweeney, "k-anonymity: A Model for Protecting Privacy," International Journal of Uncertainty, Fuzziness and Knowledge-Based Systems, vol. 1, No. 5, 2002, 14 pages.

C. Dwork, "Differential Privacy," Encyclopedia of Cryptography and Security, 2011, 12 pages.

A. P. Felt et al., "Android Permissions: User Attention, Comprehension, and Behavior," Symposium on Usable Privacy and Security, Jul. 11-13, 2012, 14 pages.

S. Von Solms et al., "On Blind Signatures and Perfect Crimes," Computers & Security, vol. 11, No. 6, 1992, 3 pages.

R. Wyden, "Wyden Releases Discussion Draft Of Legislation To Provide Real Protections For Americans' Privacy," https://www.wyden.senate.gov/news/press-releases/wyden-releases-discussion-draft-of-legislation-to-provide-real-protections-for-americans-privacy, Nov. 1, 2018, 3 pages.

M. Rubio, "Rubio Introduces Privacy Bill To Protect Consumers While Promoting Innovation," https://www.rubio.senate.gov/public/index.cfm/2019/1/rubio-introduces-privacy-bill-to-protect-consumers-while-promoting-innovation#:%7E:text=Washingt%E2%80%A6, Jan. 16, 2019, 2 pages.

C. Dwork et al., "Differential Privacy and Robust Statistics," 41st ACM Symposium on Theory of Computing, 2009, 10 pages.

J. Camenisch et al., "Compact E-Cash," Eurocrypt, vol. 3494, 2005, pp. 302-321.

D. L. Chaum, "Untraceable Electronic Mail, Return Addresses, and Digital Pseudonyms," Communications of the ACM, vol. 24, No. 2, Feb. 1981, pp. 84-88.

J. Camenisch et al., "An Efficient System For Nontransferable Anonymous Credentials With Optional Anonymity Revocation," International Conference on the Theory and Application of Cryptographic Techniques, May 6-10, 2001, 30 pages.

M. K. Reiter et al., "Crowds: Anonymity For Web Transactions," ACM Transactions on Information and System Security, vol. 1, 1997, 23 pages.

(56) References Cited

OTHER PUBLICATIONS

I. Clarke et al., "Freenet: A Distributed Anonymous Information Storage And Retrieval System," International Workshop on Designing Privacy Enhanching Technologies: Design Issues in Anonymity and Unobservability, 2001, 21 pages.
P. Golle et al., "Universal Re-encryption for Mixnets," Lecture Notes in Computer Science, Feb. 2004, 15 pages.
Y. Lindell et al., "Multiparty Computation For Privacy Preserving Data Mining," Journal of Privacy and Confidentiality, May 6, 2008, 39 pages.
J. Hollan et al., "Distributed Cognition: Toward a New Foundation for Human-Computer Interaction Research," ACM Transactions on Computer-Human Interaction, vol. 7, No. 2, Jun. 2000, pp. 174-196.
A. Adams et al., "Users are Not the Enemy," Communications of the ACM, Dec. 1999, 6 pages.
A. Morton et al., "Privacy is a Process, Not a Pet: a Theory for Effective Privacy Practice," Proceedings of the 2012 New Security Paradigms Workshop, Sep. 2012, 18 pages.
G. D. Abowd et al., "Charting Past, Present And Future Research In Ubiquitous Computing," ACM Transactions on Computer-Human Interaction, vol. 7, No. 1, Mar. 2000, pp. 29-58.
W. Mason et al., "Conducting Behavioral Research on Amazon's Mechanical Turk," Behavior Research Methods, Jun. 2011, 23 pages.
G. M. Gray et al., "Dealing with the Dangers of Fear: The Role of Risk Communication," Health Affairs, Nov. 2002, 11 pages.
U.S. Appl. No. 17/005,949 filed in the name of Bjorn Markus Jakobsson et al. on Aug. 28, 2020, and entitled "Privacy and the Management of Permissions.".
U.S. Appl. No. 17/032,759 filed in the name of Mark D. Telefus et al. on Sep. 25, 2020, and entitled "AC-Driven Light-Emitting Diode Systems.".
U.S. Appl. No. 17/047,613 filed in the name of Mark Telefus et al. on Oct. 14, 2020, and entitled "Intelligent Circuit Breakers.".
F. Stajano et al., "The Resurrecting Duckling: Security Issues for Ad-hoc Wireless Networks," International Workshop on Security Protocols, 1999, 11 pages.
L. Sweeney, "Simple Demographics Often Identify People Uniquely," Carnegie Mellon University, Data Privacy Working Paper 3, 2000, 34 pages.
A. Narayanan et al., "Robust De-anonymization of Large Sparse Datasets," IEEE Symposium on Security and Privacy, May 2008, 15 pages.
M. Alahmad et al., "Non-Intrusive Electrical Load Monitoring and Profiling Methods for Applications in Energy Management Systems," IEEE Long Island Systems, Applications and Technology Conference, 2011, 7 pages.
U.S. Appl. No. 16/527,826 filed in the name of Bjorn Markus Jakobsson on Jul. 31, 2019, and entitled "Managing Access Rights of Transferable Sensor Systems.".
U.S. Appl. No. 16/585,438 filed in the name of Bjorn Markus Jakobsson on Sep. 27, 2019 and entitled "Methods and Apparatus for Determining Preferences and Events and Generating Associated Outreach Therefrom.".
U.S. Appl. No. 16/598,614 filed in the name of Bjorn Markus Jakobsson et al. on Oct. 10, 2019, and entitled "Configuration and Management of Smart Nodes with Limited User Interfaces.".
U.S. Appl. No. 16/676,978 filed in the name of Bjorn Markus Jakobsson on Nov. 7, 2019, and entitled "Third Party Application Enablement for Node Networks Deployed in Residential and Commercial Settings.".
U.S. Appl. No. 16/682,627 filed in the name of Bjorn Markus Jakobsson et al. on Nov. 13, 2019, and entitled "Managing Power for Residentail and Commercial Networks.".
U.S. Appl. No. 16/718,157 filed in the name of Mark D. Telefus et al. on Dec. 17, 2019, and entitled "AC-Driven Light-Emitting Diode Systems.".
U.S. Appl. No. 16/720,446 filed in the name of Mark Telefus et al. on Dec. 19, 2019, and entitled "Intelligent Circuit Breakers.".

U.S. Appl. No. 16/720,485 filed in the name of Mark Telefus et al. on Dec. 19, 2019, and entitled "Intelligent Circuit Breakers with Air-Gap and Solid-State Switches.".
U.S. Appl. No. 16/720,506 filed in the name of Mark Telefus et al. on Dec. 19, 2019, and entitled "Intelligent Circuit Breakers with Solid-State Bidirectional Switches.".
U.S. Appl. No. 16/720,533 filed in the name of Mark Telefus et al. on Dec. 19, 2019, and entitled "Intelligent Circuit Breakers with Detection Circuitry Configured to Detect Fault Conditions.".
U.S. Appl. No. 16/720,583 filed in the name of Mark Telefus et al. on Dec. 19, 2019, and entitled "Intelligent Circuit Breakers with Visual Indicators to Provide Operational Status.".
U.S. Appl. No. 16/774,832 filed in the name of Bjorn Markus Jakobsson on Jan. 28, 2020 and entitled "Privacy Enhancement Using Derived Data Disclosure.".
U.S. Appl. No. 62/811,240 filed in the name of Bjorn Markus Jakobsson on Feb. 27, 2019, and entitled "Methods and Apparatus for Device Location Services.".
U.S. Appl. No. 62/846,109 filed in the name of Bjorn Markus Jakobsson on May 10, 2019, and entitled "Privacy Control and Enhancements for Distributed Networks.".
U.S. Appl. No. 62/892,883 filed in the name of Bjorn Markus Jakobsson et al.on Aug. 28, 2019, and entitled "Privacy and the Management of Permissions.".
U.S. Appl. No. 62/900,951 filed in the name of Bjorn Markus Jakobsson et al. on Sep. 16, 2019, and entitled "Performance, Privacy and Permissions.".
U.S. Appl. No. 62/963,230 filed in the name of Bjorn Markus Jakobsson on Jan. 20, 2020, and entitled "Infrastructure Support to Enhance Resource-Constrained Device Capabilites.".
U.S. Appl. No. 62/964,078 filed in the name of Mark Telefus et al. on Jan. 21, 2020, and entitled "Intelligent Power Receptacle with Arc Fault Circuit Interruption.".
U.S. Appl. No. 16/802,733 filed in the name of Bjorn Markus Jakobsson on Feb. 27, 2020, and entitled "Methods and Apparatus for Device Location Services.".
K. Yang et al. "Series Arc Fault Detection Algorithm Based on Autoregressive Bispecturm Analysis," Algorithms, vol. 8, Oct. 16, 2015, pp. 929-950.
J.-E. Park et al., "Design on Topologies for High Efficiency Two-Stage AC-DC Converter," 2012 IEEE 7th International Power Electronics and Motion Control Conference—ECCE Asia, Jun. 2-5, 2012, China, 6 pages.
S. Cuk, "98% Efficient Single-Stage AC/DC Converter Topologies," Power Electronics Europe, Issue 4, 2011, 6 pages.
E. Carvou et al., "Electrical Arc Characterization for Ac-Arc Fault Applications," 2009 Proceedings of the 55th IEEE Holm Conference on Electrical Contacts, IEEE Explore Oct. 9, 2009, 6 pages.
C. Restrepo, "Arc Fault Detection and Discrimination Methods," 2007 Proceedings of the 53rd IEEE Holm Conference on Electrical Contacts, IEEE Explore Sep. 24, 2007, 8 pages.
K. Eguchi et al., "Design of a Charge-Pump Type AC-DC Converter for RF-ID Tags," 2006 International Symposium on Communications and Information Technologies, F4D-3, IEEE, 2006, 4 pages.
A. Ayari et al., " Active Power Measurement Comparison Between Analog and Digital Methods," International Conference on Electrical Engineering and Software Applications, 2013, 6 pages.
G. D. Gregory et al., "The Arc-Fault Circuit Interrupter, an Emerging Product," IEEE, 1998, 8 pages.
D. Irwin et al., "Exploiting Home Automation Protocols for Load Monitoring in Smart Buildings," BuildSys '11 Proceedings of the Third ACM Workshop on Embedded Sensing Systems for Energy-Efficiency in Buildings, Nov. 2011, 6 pages.
B. Mrazovac et al., "Towards Ubiquitous Smart Outlets for Safety and Energetic Efficiency of Home Electric Appliances," 2011 IEEE International Conference on Consumer Electronics, Berlin, German, Sep. 6-8, 2011, 5 pages.
J. K. Becker et al., "Tracking Anonymized Bluetooth Devices," Proceedings on Privacy Enhancing Technologies, vol. 3, 2019, pp. 50-65.
H. Siadati et al., "Mind your SMSes: Mitigating Social Engineering in Second Factor Authentication," Computers & Security, vol. 65, Mar. 2017, 12 pages.

(56) References Cited

OTHER PUBLICATIONS

U.S. Appl. No. 16/871,869 filed in the name of Bjorn Markus Jakobsson on May 11, 2020, and entitled "Privacy Control and Enhancements for Distributed Networks.".
U.S. Appl. No. 63/064,399 filed in the name of Mark Telefus et al. on Aug. 11, 2020, and entitled "Energy Traffic Monitoring and Control System".
L. Shengyuan et al., "Instantaneous Value Sampling AC-DC Converter and its Application in Power Quantity Detection," 2011 Third International Conference on Measuring Technology and Mechatronics Automation, Jan. 6-7, 2011, 4 pages.
H.-H. Chang et al., "Load Recognition for Different Loads with the Same Real Power and Reactive Power in a Non-intrusive Load-monitoring System," 2008 12th International Conference on Computer Supported Cooperative Work in Design, Apr. 16-18, 2008, 6 pages.
U.S. Appl. No. 17/115,753 filed in the name of Mark Telefus on Dec. 8, 2020, and entitled "Solid-State Power Interrupters.".

* cited by examiner

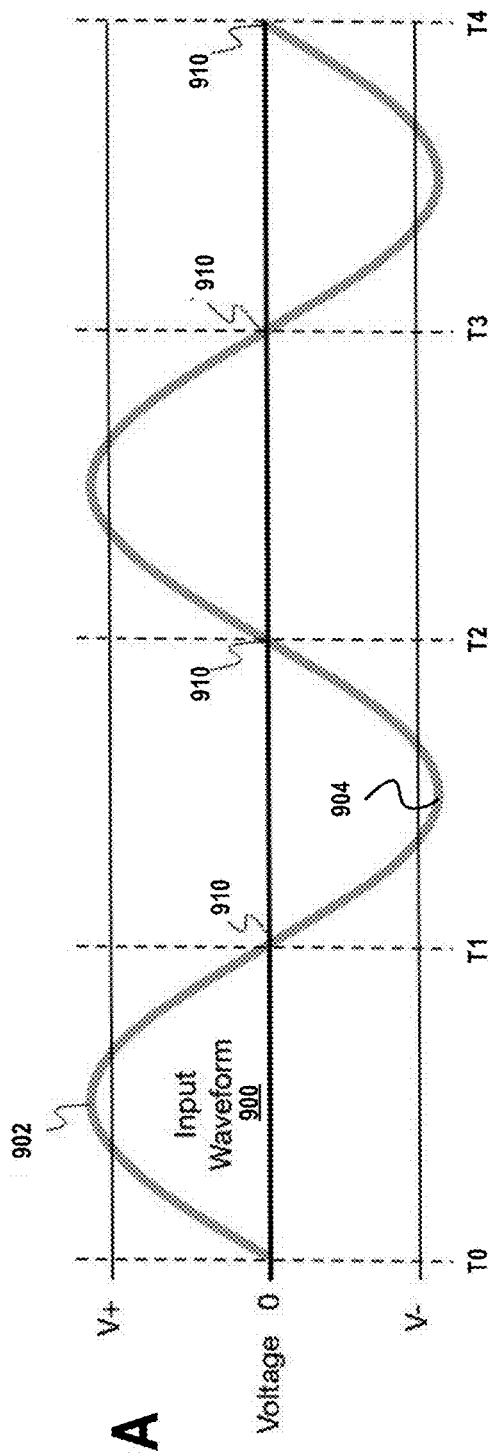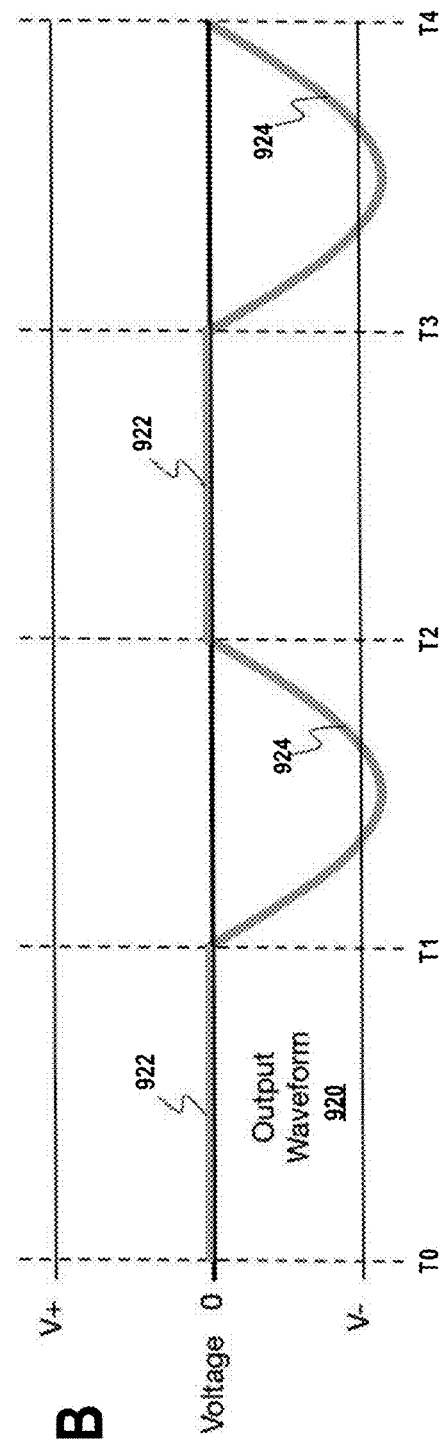

SOLID-STATE CIRCUIT INTERRUPTERS

CROSS-REFERENCE TO RELATED APPLICATION

This application is a Continuation-in-Part of U.S. patent application Ser. No. 16/149,094, filed on Oct. 1, 2018, now U.S. Pat. No. 10,985,548, the disclosure of which is incorporated herein by reference.

TECHNICAL FIELD

This disclosure relates generally to power control systems and devices and, in particular, solid-state circuit interrupter devices and systems for disrupting power loads under fault conditions or hazardous conditions.

BACKGROUND

Electrical circuit interrupters are an essential component in electrical distribution systems and are often positioned between an incoming high-current utility supply circuit and lower current branch circuits within a given building or home structure to protect branch circuit conductors and electrical loads from being exposed to over-current conditions. There are several types of over current conditions including overload conditions and fault conditions. An overload condition is defined as operation of equipment in excess of its normal, full-load rating, or a branch circuit in excess of its ampacity which, when the overload persists for a sufficient period of time, would cause damage or dangerous overheating. Fault conditions comprise unintended or accidental load conditions that typically produce much higher over-current conditions than do overloads, depending on the impedance of the fault. A fault producing the maximum over-current condition is referred to as a short-circuit or a "bolted fault."

Conventional circuit interrupters are electromechanical in nature and have electrical contacts that are physically separated by either manual intervention of an operator lever or automatically upon the occurrence of a fault condition or prolonged over current condition, in which cases the circuit interrupter is deemed to be "tripped." The separation of the electrical contacts of a circuit breaker can be performed electromagnetically or mechanically, or a combination of both.

A significant problem with conventional circuit interrupters is that they are slow to react to fault conditions due to their electromechanical construction. Conventional circuit interrupters typically require at least several milliseconds to isolate a fault condition. The slow reaction time is undesirable since it raises the risk of hazardous fire, damage to electrical equipment, and arc-flashes, which can occur at the short-circuit location when a bolted fault is not isolated quickly enough. An arc-flash is an electrical explosion of the electrical conductors that create the short-circuit condition. The energy release in arc-flash can produce temperatures exceeding 35,000° F. at the terminals, resulting in rapidly vaporizing metal conductors, blasting molten metal, as well as expanding plasma that is ejected outwards with extreme force. Therefore, arc-flashes are extremely hazardous to life, property and electrical equipment, particularly in industrial and residential applications where the risk of a gas leak is significant.

In addition to being slow at isolating faults, conventional circuit interrupters exhibit large variations in both the time to trip and the current trip limit in response to a fault or prolonged over-current conditions. This variation is predominately due to the limitations of the electromechanical design of the circuit breaker device and the influence of physical factors such as mounting stresses and temperature variation. The variations in the time to trip and the current trip limit can themselves vary from device to device even when the devices are of the same type, the same rating, and the same manufacturer.

Conventional circuit interrupters provide high isolation capability once they have been tripped. However, their slow reaction times, lack of precision and high degree of variability are all very undesirable characteristics. Not only do the slow reaction times result in inadequate protection against the possibilities of arc flashes, but the high degree of variability and lack of precision make coordination between multiple circuit interrupters in a complex system almost impossible.

As a protection device, a circuit interrupter must be able to isolate a fault from the utility supply circuit even when the fault current greatly exceeds the circuit interrupter trip current rating and, thereby, protect against being an internal single point of failure. The Ampere Interrupting Capacity (AIC) rating of a circuit interrupter indicates the maximum fault current (in amperes) that the circuit interrupter device will safely clear when a fault is applied at the load side of the circuit interrupter device. The AIC rating of a circuit interrupter device denotes the maximum fault current that can be interrupted by the circuit interrupter device without failure of the circuit interrupter device. The AIC rating demands an extremely high level of short-circuit protection and domestic circuit interrupters are often rated at an AIC of 10,000 amperes or more.

SUMMARY

Embodiments of the disclosure include solid-state circuit interrupter devices and systems for interrupting power from a source to a load. For example, in one embodiment, a circuit interrupter, comprises a solid-state switch and a mode control circuit. The solid-state switch is serially connected between a line input terminal and a load output terminal of the circuit interrupter, and is configured to be placed in one of (i) a switched-on state to provide an electrical connection in an electrical path between the line input terminal and the load output terminal, and (ii) a switched-off state. The mode control circuit is configured to implement a first control mode and a second control mode to control operation of the circuit interrupter. The first control mode is configured to generate a self-bias turn-on threshold voltage for the solid-state switch during power-up of the circuit interrupter, while maintaining the solid-state switch in the switched-off state until the self-bias turn-on threshold voltage is generated. The second control mode is configured to disrupt the self-bias turn-on threshold voltage and place the solid-state switch into the switched-off state.

In another embodiment, a circuit interrupter comprises a solid-state switch, an air-gap electromagnetic switch, a switch controller, a zero-crossing sensor, and a current sensor. The solid-state switch and the air-gap electromagnetic switch are connected in series between a line input terminal and a load output terminal of the circuit interrupter. The switch controller is configured to control operation of the solid-state switch and the air-gap electromagnetic switch. The zero-crossing sensor is configured to detect zero crossings of a supply power waveform input to the line input terminal of the circuit interrupter. The current sensor is configured to sense a current flowing in the electrical path between the line input terminal and the load output terminal, and detect a fault condition. In response to detection of a fault condition by the current sensor, the switch controller is configured to generate switch control signals to (i) place the solid-state switch into a switched-off state and (ii) place the air-gap electromagnetic switch into a switched-open state after the solid-state switch is placed into the switched-off state. The switch controller utilizes zero-crossing detection signals output from the zero-crossing sensor to detect a zero-crossing event of the supply power waveform and place the air-gap electromagnetic switch into the switched-open state in response to the detected zero-crossing event.

Other embodiments will be described in the following detailed description of embodiments, which is to be read in conjunction with the accompanying figures.

BRIEF DESCRIPTION OF THE DRAWINGS

FIG. 9A illustrates a power supply voltage waveform that is input to a line side of the solid-state circuit interrupter of FIG. 8.

FIG. 9B illustrates an output voltage waveform on a load side of the solid-state circuit interrupter of FIG. 8 when a solid-state switch of the circuit interrupter is in a switched-off state and an air-gap electromagnetic switch of the circuit interrupter is in a switched-closed state.

DETAILED DESCRIPTION OF EXEMPLARY EMBODIMENTS

Embodiments of the disclosure will now be described in further detail with regard to solid-state circuit interrupter devices and systems for interrupting power from a source to a load based on the detection of fault conditions (e.g., short-circuit faults, over-current faults, ground faults, arc faults, etc.) and the detection of hazardous environmental conditions (e.g., flooding, chemical spills, gas leaks, etc.). It is to be understood that same or similar reference numbers are used throughout the drawings to denote the same or similar features, elements, or structures, and thus, a detailed explanation of the same or similar features, elements, or structures will not be repeated for each of the drawings. In addition, the terms "about" or "substantially" as used herein with regard to percentages, ranges, etc., are meant to denote being close or approximate to, but not exactly. For example, the term "about" or "substantially" as used herein implies that a small margin of error is present, such as 1% or less than the stated amount. The term "exemplary" as used herein means "serving as an example, instance, or illustration". Any embodiment or design described herein as "exemplary" is not to be construed as preferred or advantageous over other embodiments or designs.

Figure 1A:
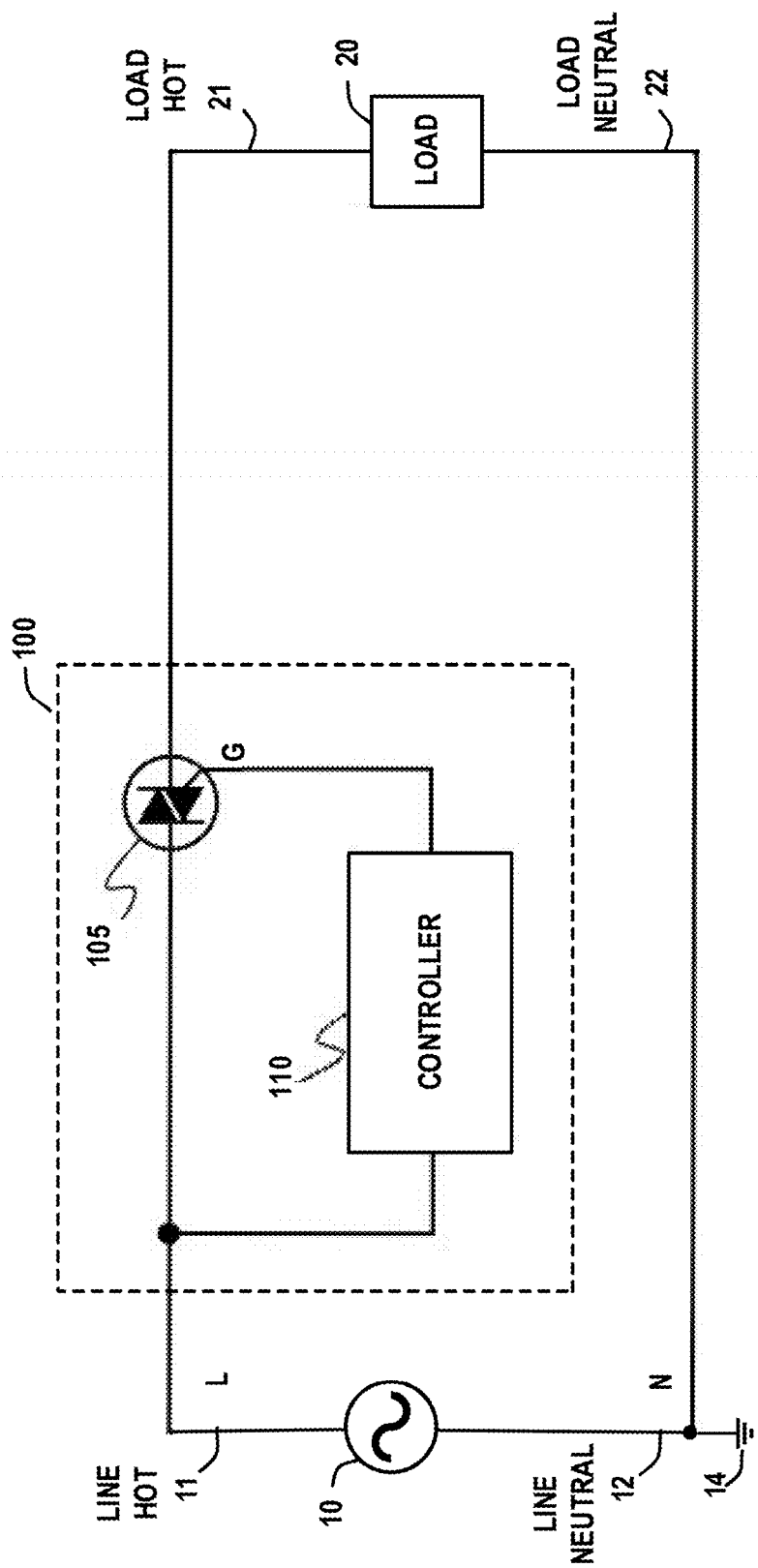
FIG. 1A schematically illustrates a conventional embodiment of a circuit interrupter.

FIG. 1A schematically illustrates a conventional embodiment of a circuit interrupter. In particular, FIG. 1A illustrates a circuit interrupter 100 connected between a utility power supply 10 (referred to herein as AC mains 10) and a load 20 which is connected to a branch circuit that is protected by the circuit interrupter 100. As further illustrated in FIG. 1A, the circuit interrupter 100 is connected between a hot phase 11 (referred to as "line hot") of the AC mains 10 and a load hot line 21 of the load 20, while a neutral phase 12 (referred to as "line neutral") of the AC mains 10 is directly connected to a load neutral line 22 of the load 20. As further illustrated in FIG. 1A, the line neutral 12 is shown bonded to earth ground 14 (GND), which provides added protections as is known in the art.

The circuit interrupter 100 comprises an AC switch 105 and a controller 110. The AC switch 105 comprises a TRIAC or a silicon controlled rectifier (SCR). The TRIAC switch 105 is a three terminal electronic device that conducts current in both directions under control of the controller 110. The TRIAC is often found in conventional wall-mounted dimming switches. The controller 110 is representative of many possible control embodiments whether they be logic gates, a microcontroller, or an electromechanical control such as the bi-metal bending strips utilized in conventional circuit breakers. The controller 110 can apply a control signal to a gate (G) of the TRIAC switch 105 for phase angle modulation and to turn the TRIAC switch 105 on and off. The phase angle control of the TRIAC switch 105 allows control of the average current flowing into the load 20, and is commonly used for controlling the speed of a motor, dimming lights, or controlling electric heaters, etc.

Figure 1B:
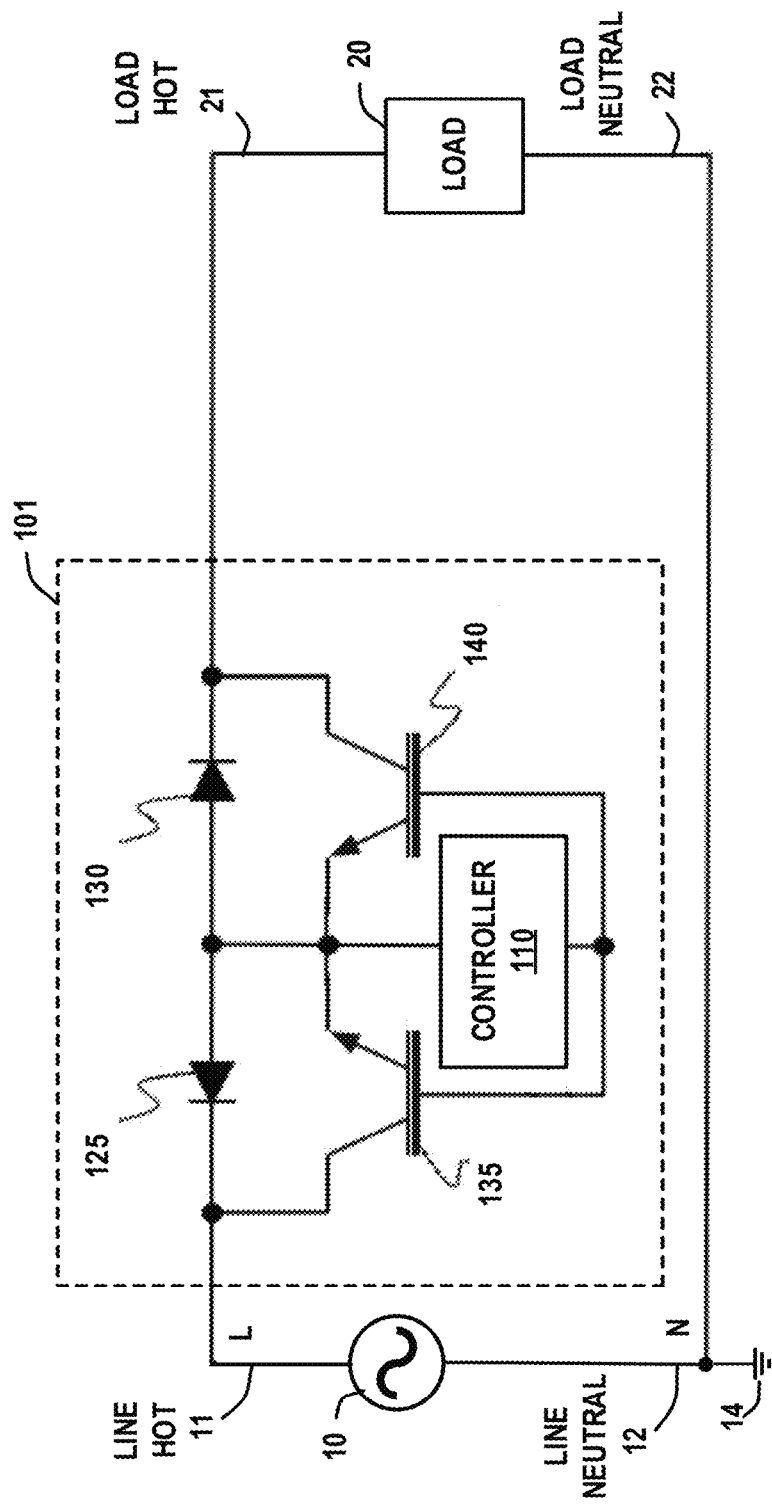
FIG. 1B schematically illustrates another conventional embodiment of a circuit interrupter.

FIG. 1B schematically illustrates another conventional embodiment of a circuit interrupter 101. The circuit interrupter 101 comprises a controller 110 and an AC switch which comprises a first diode 125, a second diode 130, a first transistor 135, and a second transistor 140, which are interconnected as shown in FIG. 1B. The first and second transistors 135 and 140 comprise insulated-gate bipolar transistor (IGBT) devices. The controller 110 controls current flow by injecting a control signal simultaneously into the first and second transistors 135 and 140. In the AC switch configuration shown in FIG. 1B, current only flows through first switch 135 and the second diode 130 in a positive half-cycle of a supply voltage waveform of the AC mains 10, while current only flows through the second switch 140 and the first diode 125 during negative half-cycles of the supply voltage waveform of the AC mains 10.

A disadvantage of the circuit interrupter 101 shown in FIG. 1B is that it requires the implementation of four discrete elements (e.g. diodes 125 and 130 and BJT devices 135 and 140). In addition, the BJT devices 135 and 140 do not efficiently operate as bidirectional switches, and the discrete diodes 125 and 130 must be utilized for bidirectional switching. In addition, the discrete diodes 125 and 130 have relatively large forward bias voltage drops of about 0.7 V, as compared to the forward bias voltage drop of about 0.1 V-0.2 V of the BJT devices 135 and 140. As such, the diodes 125 and 130 increase the power dissipation of the circuit interrupter 101.

Figure 1C:
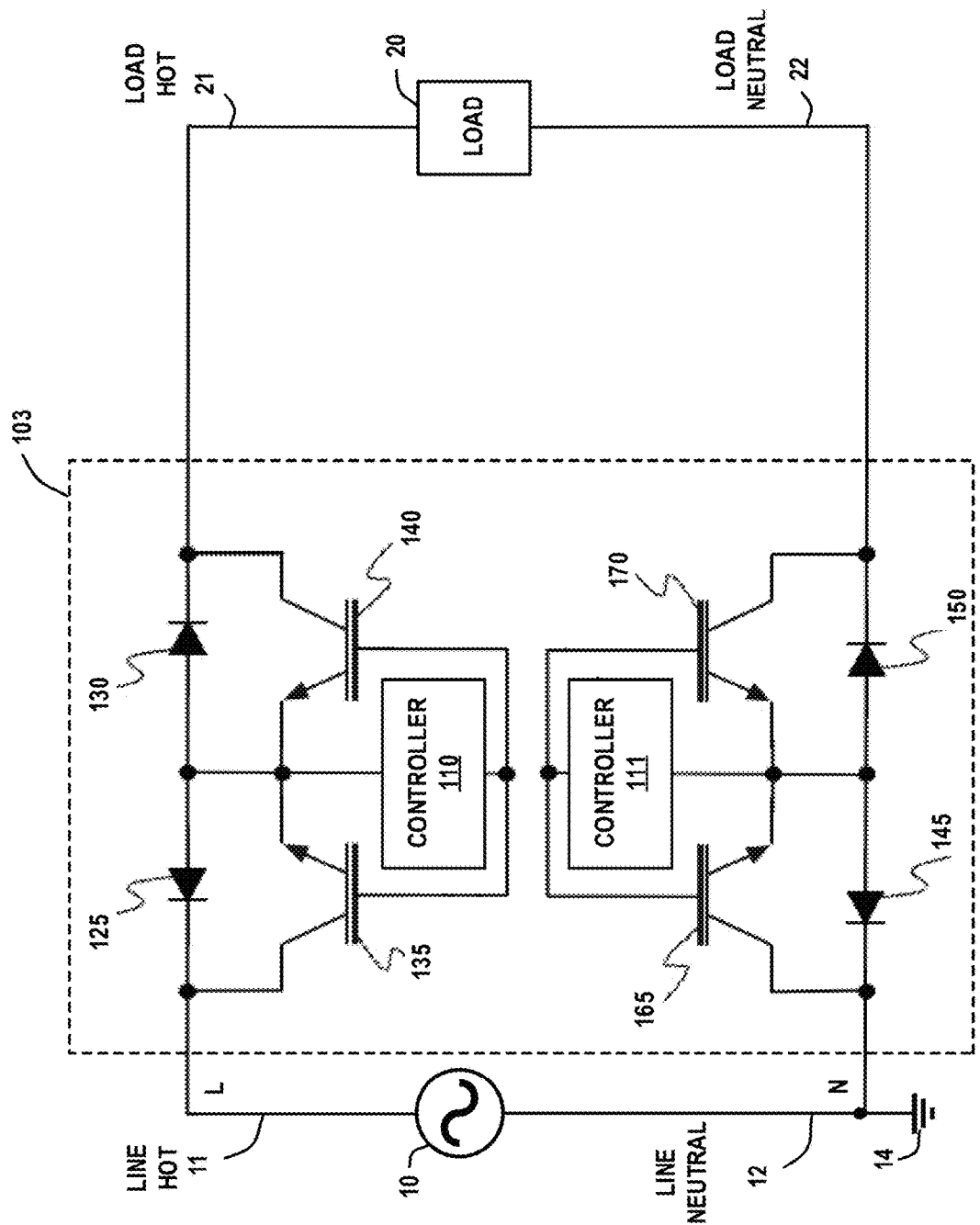
FIG. 1C schematically illustrates another conventional embodiment of a circuit interrupter.

FIG. 1C schematically illustrates another conventional embodiment of a circuit interrupter 103. The circuit interrupter 103 is similar to the circuit interrupter 101 of FIG. 1B in that the circuit interrupter 103 comprises a first controller 110 and a first AC switch which comprises a first diode 125, a second diode 130, a first transistor 135, and a second transistor 140, which are interconnected as shown in FIG. 1C to provide bidirectional switching in the electrical path between the line hot 11 and the load hot 21. The circuit interrupter 103 further comprises a second controller 111 and a second AC switch which comprises a first diode 145, a second diode 150, a first transistor 165, and a second transistor 170, which are interconnected as shown in FIG. 1C to provide bidirectional switching in the electrical path between the line neutral 12 and the load neutral 22. The transistors 135, 140, 165, and 170 comprise insulated-gate bipolar transistors.

The first controller 110 controls current flow by applying a control signal simultaneously to switches 135 and 140, while the second controller 111 controls current flow by applying a control signal simultaneously to switches 165 and 170. During positive half cycles of the AC supply voltage waveform of the AC mains 10, current flows (i) in the hot line path through the switch 135 and the diode 130 and (ii) in the neutral line path through the switch 170 and the diode 145. On the other hand, during negative half cycles of the AC supply voltage waveform of the AC mains 10, current flows (i) in hot line path through the switch 140 and the diode 125 and (ii) in the neutral line path through the switch 165 and the diode 150. This configuration of simultaneously controlling AC switches on both line and neutral is referred to as double-pole switching and may be applied to two lines of differing phase from a single AC energy source. Double pole switching of line and neutral is a common AC switching technique in the life saving applications of ground-fault circuit interrupters. The circuit interrupter 103 has similar disadvantages as the circuit interrupter 102 discussed above, but enhanced by the fact that the circuit interrupter includes 4 additional discrete components with the additional diodes 145 and 150 increasing power dissipation.

Exemplary embodiments of the disclosure as shown in FIGS. 2, 3, 4, 5, 6, 7, and 8 include novel architectures for circuit interrupter devices and systems that can be positioned between an input energy source and an output load. While the exemplary circuit interrupters are generically depicted as connecting an AC mains 10 and load 20, it is to be understood that the exemplary circuit interrupters can be embodied in various devices and applications. For example, in some embodiments, the circuit interrupters shown in FIGS. 2-8 can be implemented in an electrical circuit breaker device (e.g., intelligent circuit breaker device), which is disposed in a circuit breaker distribution panel. In addition, in some embodiments, the circuit interrupters shown in FIGS. 2-8 can be implemented in an electrical receptacle device, or an electrical light switch (e.g., a wall-mounted light switch or a light switch implemented in a smart light fixture or smart ceiling light bulb socket, etc.). In other embodiments, the circuit interrupters shown in FIGS. 2-8 may comprise standalone devices that can be disposed within a gang box in an electrical network of a home or building and configured to protect one or more electrical devices, appliances, loads, etc. that are connected in a branch circuit downstream of the standalone circuit interrupter device.

Figure 2:
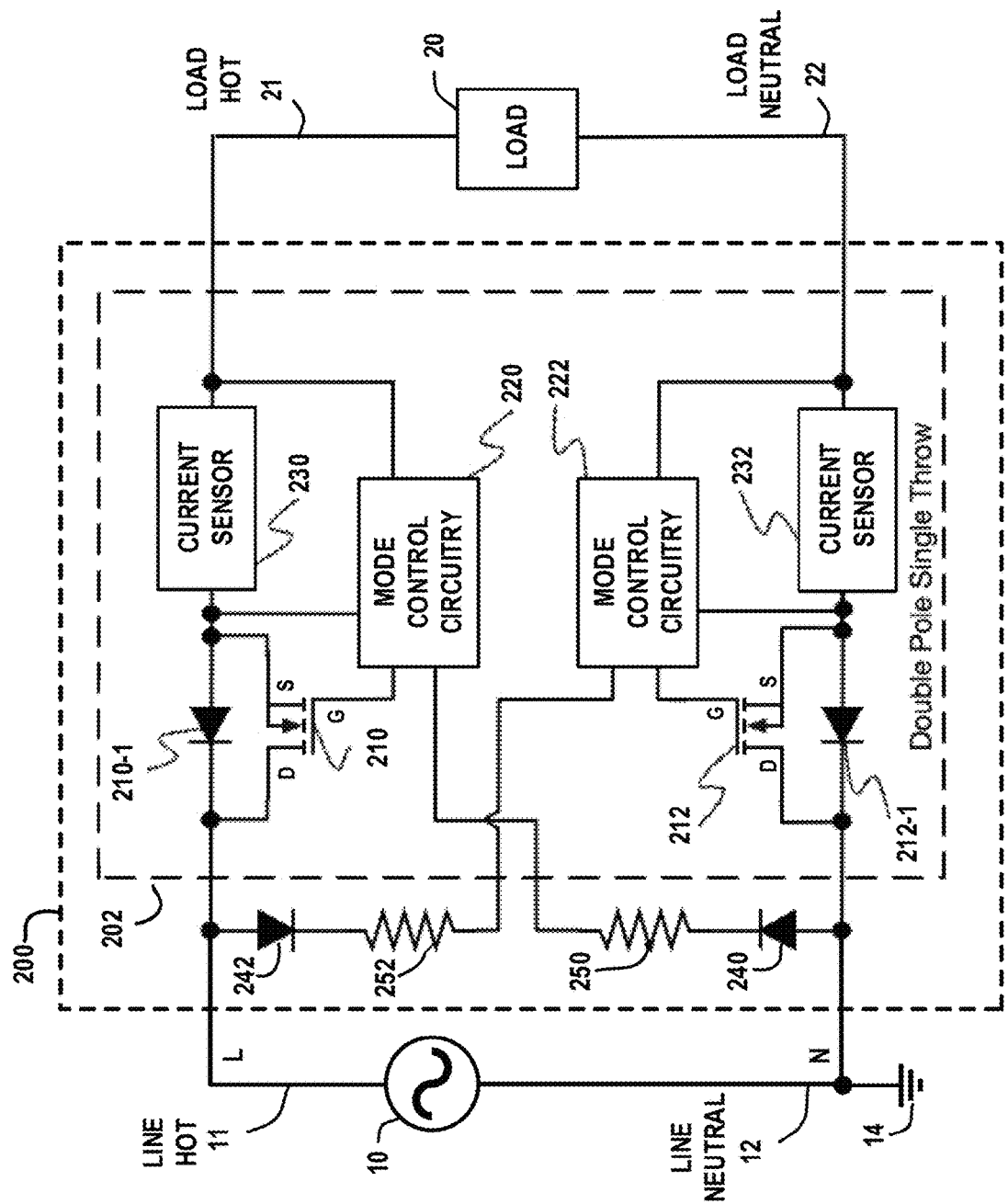
FIG. 2 schematically illustrates a solid-state circuit interrupter according to an embodiment of the disclosure.

FIG. 2 schematically illustrates a solid-state circuit interrupter according to an embodiment of the disclosure. In particular, FIG. 2 schematically illustrates a solid-state circuit interrupter 200 connected between an AC mains 10 and a load 20. The solid-state circuit interrupter 200 comprises a double pole single throw (DPST) switch circuit 202 which comprises a first solid-state switch 210, a second solid-state switch 212, a first mode control circuit 220, a second mode control circuit 222, a first current sensor 230, and a second current sensor 232. The solid-state circuit interrupter 200 further comprises a first bias branch circuit comprising a first diode 240 and a first resistor 250, and a second bias branch circuit comprising a second diode 242 and a second resistor 252. The first diode 240 and the first resistor 250 are serially connected between the line neutral 12 and the first mode control circuit 220. The second diode 242 and the second resistor 252 are serially connected between the line hot 11 and the second mode control circuit 222.

In the exemplary embodiment of FIG. 2, the first and second solid-state switch elements 210 and 212 comprises power MOSFET (metal-oxide semiconductor field-effect transistor) devices and, in particular, N-type enhancement MOSFET devices having gate terminals (G), drain terminals (D), and source terminals (S) as shown. In the exemplary embodiment of FIG. 2 (and other embodiments discussed herein), the first and second solid-state switches 210 and 212 comprise respective intrinsic body diodes 210-2 and 212-1, which represent the P-N junctions between a P-type substrate body to N-doped drain regions of the MOSFET devices. In this regard, the body diodes 210-1 and 212-1 are intrinsic elements of the MOSFET switches 210 and 212 (i.e., not discrete elements). It is to be noted that the intrinsic body-to-source diodes of the solid-state switches 210 and 212 are not shown as it is assumed that they are shorted out by connections between the source regions and the substrate bodies (e.g., N+ source and P body junction are shorted through source metallization).

The first and second mode control circuits 220 and 222 are configured to implement multiple control modes for the solid-state interrupter 200 including (i) a self-bias turn-on threshold voltage control mode and (ii) a forced turn-off control mode. In some embodiments, the self-bias turn-on threshold voltage control mode utilizes a self-biasing circuit to generate a target turn-on threshold voltage level for the solid-state switches 210 and 212, while preventing the solid-state switches 210 and 212 from turning on before the target self-bias turn-on threshold voltage level is reached and applied to the solid-state switches 210 and 212 to turn-on the solid-state switches 210 and 212.

As explained in further detail below, a self-bias network is configured to delay the application of a gate voltage to the gate terminals of the solid-state switches 210 and 212 which delay is long enough to prevent premature "turn-on" of the switches 210 and 212 before the self-bias turn-on threshold voltage level is generated. Indeed, the premature turn-on of the solid-state switches 210 and 212 would prevent the generation of the self-bias turn-on threshold voltage to the target voltage level. The self-bias turn-on threshold voltage control mode is supported by the first and second bias branch circuits with an opposite cycle arrangement comprised of the diodes 240 and 242 and the resistors 250 and 252.

In some embodiments, the forced turn-off control mode of the first and second mode control circuits 220 and 222 is configured to force a turn-off of the solid-state switches 210 and 212 in response to the detection of certain events including, but not limited to, detection of fault events, detection of hazardous environmental conditions, remote commands for circuit interruption, etc. As explained in further detail below, the forced turn-off control mode can be initiated on commands by, e.g., direct hardware fault sensing and control, and/or through a galvanically isolated control input based on, but not limited to, optical, magnetic, capacitive, and RF isolation technologies.

In some embodiments, the first and second current sensors 230 and 232 are configured to sense a magnitude of current flowing to and from the load 20 and generate current sense data that is utilized by the first and second mode control circuits 220 and 222 to identify fault events such as short-circuit fault events, over-current fault events, arc fault events, etc. In response to the detection of such fault events, the first and second current sensors 230 and 232 are configured to trigger the force turn-off mode which results in the first and second solid-state switches 210 and 212 being turned-off. The first and second current sensors 230 and 232 may be implemented using various types of sensing techniques and circuits, including, but not limited to, sensing techniques that are based on sense resistors, current transformers, Hall-effect sensors, or the internal impedance (drain-source resistance) of the solid-state switches 210 and 212. The mode control circuits 220 and 222 can be implemented using various types of control architectures based on, e.g., logic gates, microcontrollers, electromechanical control devices, etc.

In normal operation of the solid-state interrupter 200, during positive half-cycles of the supply voltage waveform of the AC mains 10, the first mode control circuit 230 applies the generated self-bias turn-on threshold voltage to the gate terminal of the first solid-state switch 210 to turn on the first solid-state switch 210. In this configuration, the positive current flows from the line hot 11 through the first solid-state switch 210 to the load 20, and current returns to the line neutral 12 through the forward-biased intrinsic diode 212-1 of the second solid state switch 212. On the other hand, during negative half-cycles of the supply voltage waveform of the AC mains 10, the second mode control circuit 222 applies the generated self-bias turn-on threshold voltage to the gate terminal of the second solid-state switch 212 to turn on the second solid-state switch 212. In this configuration, the negative current flows from the line neutral 12 through the second solid-state switch 212 to the load 20, and current returns to the line hot 11 through the forward-biased intrinsic diode 210-1 of the first solid-state switch 210.

Figure 3:
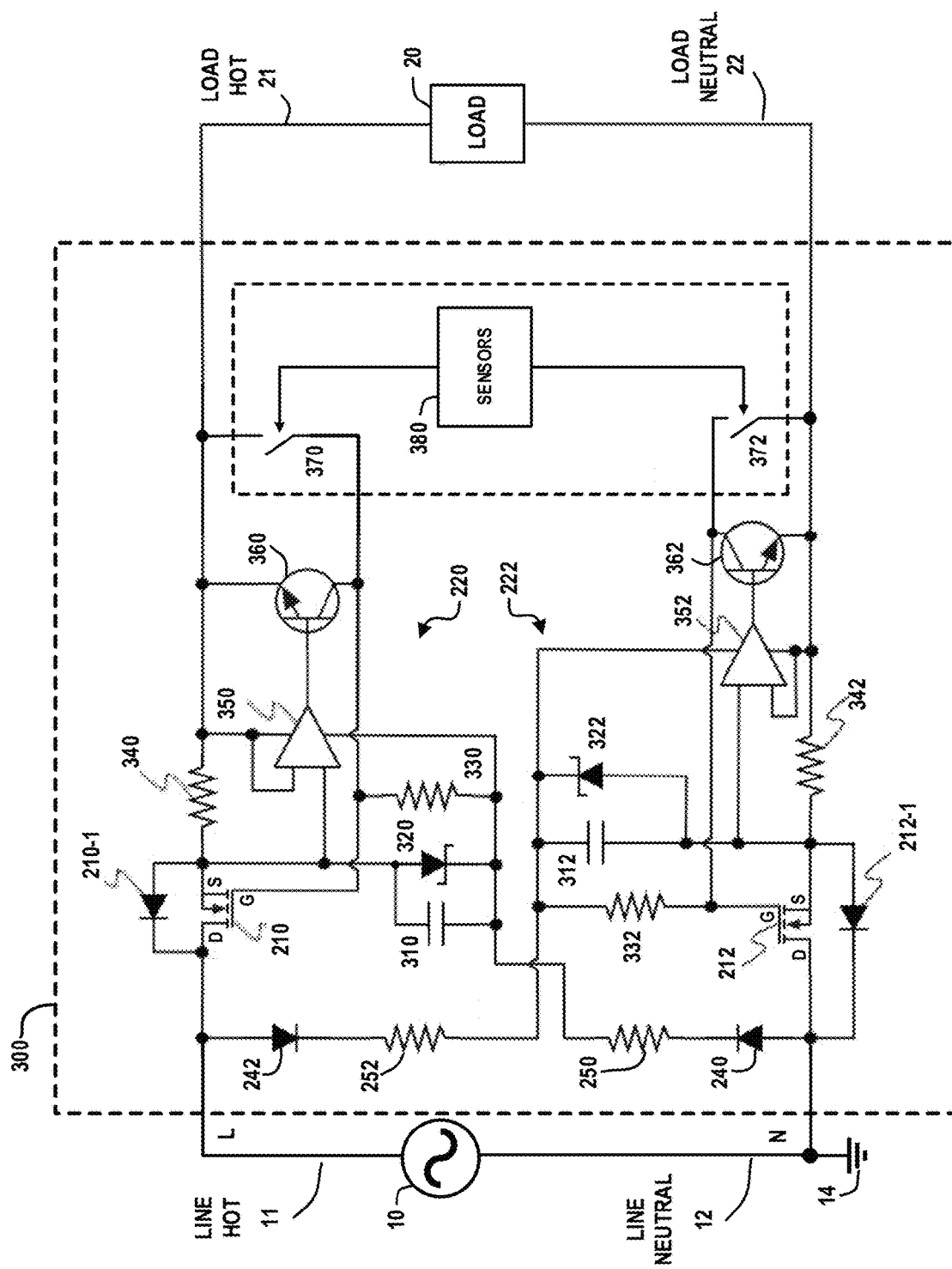
FIG. 3 schematically illustrates a solid-state circuit interrupter according to another embodiment of the disclosure.

FIG. 3 schematically illustrates a solid-state circuit interrupter according to another embodiment of the disclosure. In particular, FIG. 3 schematically illustrates a solid-state circuit interrupter 300 which is based on the framework of FIG. 2, but which further illustrates an exemplary embodiment of the first and second mode control circuits 220 and 222. As shown in FIG. 3, the first mode control circuit 220 comprises a capacitor 310, a Zener diode 320, a resistor 330, an operational amplifier 350 (configured as a comparator), control switches 360 and 370, and sensors 380. Similarly, the second mode control circuit 222 comprises a capacitor 312, a Zener diode 322, a resistor 332, an operational amplifier 352 (configured as a comparator), control switches 362 and 372, and sensors 380. The mode control circuits provide exemplary embodiments for implementing (i) a self-bias turn-on threshold voltage control mode using the circuit components 310/312, 320/322, 330/332, 350/352, and 360/362, and (ii) a forced turn-off control mode using the circuit components 340/342, 370/372, and sensors 380.

For example, for the self-bias turn-on threshold voltage control mode, the comparators 350 and 352 will output a control voltage which is sufficient to activate the control switches 360 and 362 and effectively short the gate-to-source of the first and second solid-state switches 210 and 212. The solid-state switches 210 and 212 are maintained in a switched-off state for a sufficient amount of time to generate the self-bias turn-on threshold voltages for the solid-state switches 210 and 212.

For example, during a positive half cycle of the AC supply voltage waveform of the AC mains 10, current flows from the line hot 11 to the line neutral 12 through the second branch circuit (comprising the diode 242 and the resistor 252), the capacitor 312, and the body diode 212-1. This current flow causes a voltage across the capacitor 312 to increase until the capacitor voltage reaches a target self-bias turn-on threshold voltage level across the capacitor 312 which represents a clamping voltage (i.e., reverse breakdown voltage of the Zener diode 322, referred to as Zener voltage). In other words, the Zener voltage of the Zener diode 322 limits the maximum level of the self-bias turn-on threshold voltage ($V_{GS}$) which is generated to turn on the second solid-state switch 212.

Next, during a negative half cycle of the AC supply voltage waveform of the AC mains 10, current flows from the line neutral 12 to the line hot 11 through the first branch circuit (comprising the diode 240 and the resistor 250), the capacitor 310, and the body diode 210-1. This current flow causes a voltage across the capacitor 310 to increase until the capacitor voltage reaches target turn-on threshold voltage level across the capacitor 310 which represents a clamping voltage (Zener voltage) of the Zener diode 320. In other words, the Zener voltage of the Zener diode 320 limits the maximum level of the self-bias turn-on threshold voltage ($V_{GS}$) which is generated to turn on the first solid-state switch 210.

In this exemplary embodiment, the target threshold voltage level for the solid-state switches 210 and 212 is limited by the Zener voltages of the Zener diodes 320 and 322 such that the Zener diodes 320 and 322 serve as a solid-state clamp to limit the turn-on threshold voltage. In this regard, the self-bias turn-on threshold voltage control mode is input-line voltage independent, as the level of the self-bias turn-on threshold voltage is limited by the solid-state clamp.

As noted above, in the exemplary mode control framework of FIG. 3, the solid-state switches 210 and 212 are maintained in a switched-off state for a sufficient period of time to charge the capacitors 310 and 312 to the Zener voltages of the Zener diodes 320 and 322. In some embodiments, the Zener voltage is about 15 V, and the turn-on threshold voltage of the solid-state switches 210 and 212 is in a range of about 10 V to about 15 V. If the solid-state switches 210 and 212 turn on prematurely before reaching the clamping voltage of the Zener diodes 320 and 322 due to, e.g., leakage, Miller capacitance of the MOSFET devices, etc., the solid-state switches 210 and 212 can actually turn on with less than 2 V of gate-to-source voltage, which would prevent the capacitors 310 and 312 from being charged enough to generate a capacitor voltage which corresponds to the clamping voltage of the Zener diodes 320 and 322. In this regard, the self-bias turn-on threshold voltage control mode is configured to maintain the control switches 360 and 362 turned-on for a period of time which is sufficient keep the first and second solid-state switches 210 and 212 turned-off and allow the capacitors 310 and 312 to be charged to the clamping voltages of the Zener diodes 320 and 322.

As noted above, the mode control circuits 220 and 222 implement a forced turn-off control mode using the circuit components 340, 342, 370, 372, and 380. In particular, during operation of the solid-state circuit interrupter 300, the switches 370 and 372 can be activated by one of the sensors 380 to effectively shunt the gate-to-source terminals and turn-off the solid-state switches 210 and 212. The sensors 380 can include one or more of various types of sensors. For example, in some embodiments, the sensors 380 include a current sensor which is configured to measure a voltage drop across the sense resistors 340 and 342 and determine a magnitude of current flowing in the hot line path and neutral line paths between the AC mains 10 and the load 20 based on the measured voltage drops across the current sense resistors 340 and 342. In some embodiments, the sense resistors 340 and 342 have very small resistance values (e.g., on the order of 10× less than 1 milli-Ohm), and as such the voltage potential across the sense resistors 340 and 342 is negligible but yet sufficient for current sensing. The operational amplifiers 350 and 352 are configured with sufficient gain to be able to drive the respective control switches 360 and 362, even with a relatively small voltage input corresponding to the voltage drops across the sense resistors 340 and 342.

In other embodiments, the sensors 380 include one or more sensors that are configured to sense environmental conditions. For example, the sensors 380 can include one or more of (i) a chemical sensitive detector that is configured to detect the presence of hazardous chemicals, (ii) a gas sensitive detector that is configured to detect the presence of hazardous gases, (iii) a temperature sensor that is configured to detect high temperatures indicative of, e.g., a fire; a (iv) a piezoelectric detector that is configured to detect large vibrations associated with, e.g., explosions, earthquakes, etc., (v) a humidity sensor or water sensor that is configured to detect floods or damp conditions, and other types of sensors that are configured to detect for the presence or occurrence of hazardous environmental conditions that would warrant circuit interruption.

In some embodiments, the control switches 370 and 372 comprise optical transistors (e.g., phototransistor, etc.) or other types of optically controlled switches which receive signals from complementary light emitting diodes (LED) that are controlled by, e.g., a sensor device or a microcontroller. This optical coupling between the sensors 380 and the control switches 370 and 372 essentially provides galvanic isolation between the force turn-off control circuit and the switching circuit of the solid-state circuit interrupter 300. In other embodiments, galvanic isolation can be implemented using magnetic, capacitive, or radio frequency (RF) isolation technologies.

In other embodiments, the control switches 370 and 372 can be activated in response to remote commands (e.g., alarm signals) received from a local or remote controller that is configured to detect faults, or remote commands received from an individual that can control operation of the solid-state circuit interrupter 300 through smart technologies implemented using, for example, an Internet-of-Things (IoT) wireless computing network, wherein the solid-state circuit interrupter 300 comprises a smart wireless IoT device.

Figure 4:
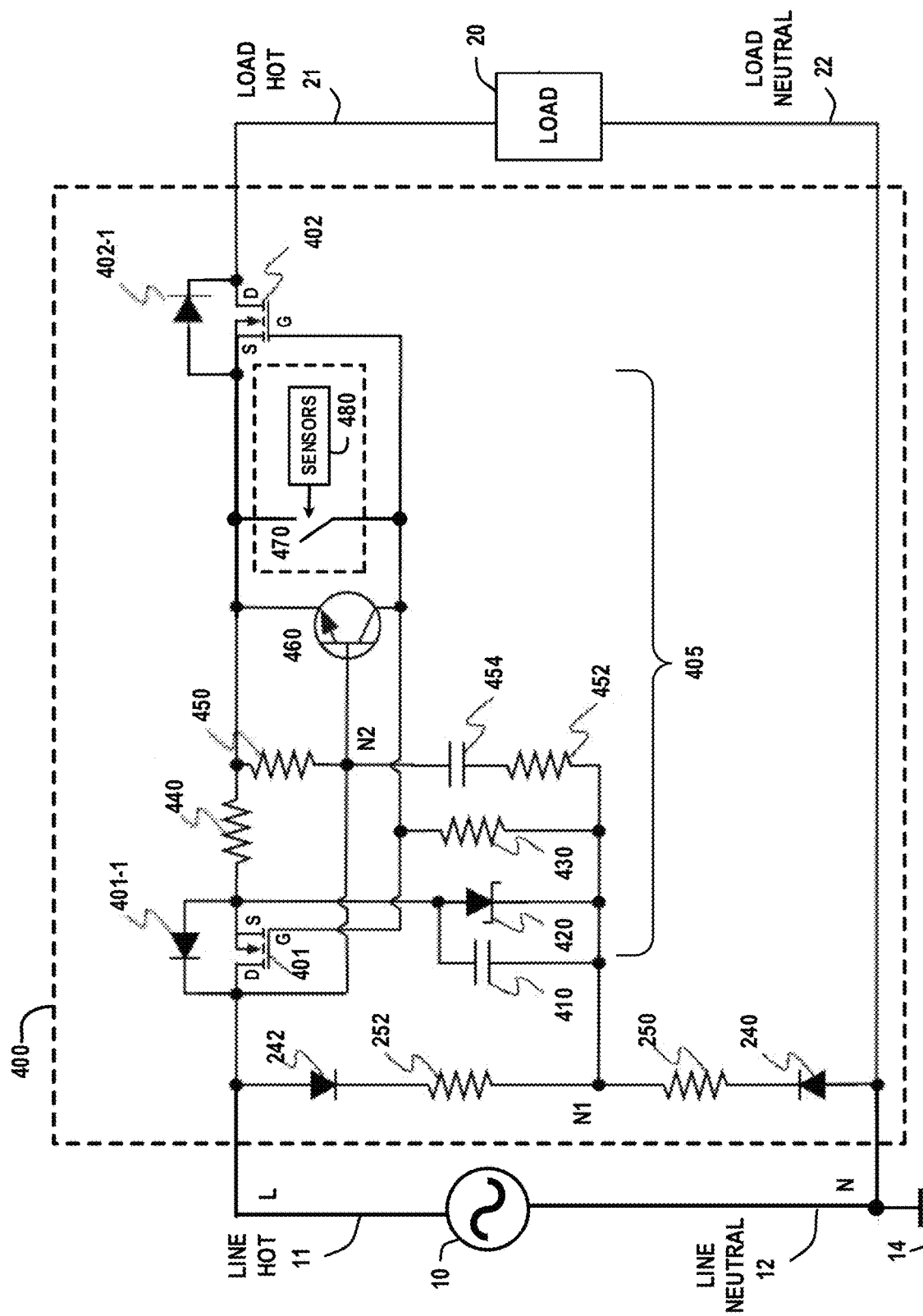
FIG. 4 schematically illustrates a solid-state circuit interrupter according to another embodiment of the disclosure.

FIG. 4 schematically illustrates a solid-state circuit interrupter according to another embodiment of the disclosure. In particular, FIG. 4 illustrates a solid-state circuit interrupter 400 connected between an AC mains 10 and a load 20. The solid-state circuit interrupter 400 comprises a single pole switch circuit which comprises a first solid state switch 401 and associated body diode 401-1, and a second solid-state switch 402 and associated body diode 402-1. The first and second solid-state switches 401 and 402 are serially connected in the electrical path between the line hot 11 and the load hot 21, with source terminals (S) serially connected through a sense resistor 440, to thereby implement a bidirectional solid-state switch. The solid-state circuit interrupter 400 further comprises a first bias branch circuit comprising a first diode 240 and a first resistor 250, and a second bias branch circuit comprising a second diode 242 and a second resistor 252, which are serially connected between the line hot 11 and line neutral 12 as shown.

The solid-state interrupter 400 further comprises a mode control circuit 405 which comprises a first capacitor 410, a Zener diode 420, resistors 430, 440, 450, and 452, a second capacitor 454, a first control switch 460, a second control switch 470, and sensors 480. The first and second bias branch circuits are connected to an input node N1 of the mode control circuit 405. The mode control circuit 405 shown in FIG. 4 comprises another exemplary embodiment for implementing each of the mode control circuits 220 and 222 of FIG. 2. The mode control circuit 405 is configured to implement (i) a self-bias turn-on threshold voltage control mode using the circuit components 410, 420, 430, 450, 452, 454, and 460 and (ii) a forced turn-off control mode using the circuit components 440, 470 and 480.

For example, for the self-bias turn-on threshold voltage control mode, the resistors 450 and 452 and the capacitor 454 will generate a voltage at node N2 which is sufficient to activate the first control switch 460 and effectively short the gate-to-source of the first and second solid-state switches 401 and 402. The voltage at node N2 will maintain the solid-state switches 401 and 402 turned-off for a delayed time period which corresponds to the RC time constant of the resistor 452 and the capacitor 454.

During this RC time constant delay period, and during a negative half cycle of the AC supply voltage waveform of the AC mains 10, current flows from the line neutral 12 to the line hot 11 through the first branch circuit (comprising the diode 240 and the resistor 250), the capacitor 410, and the body diode 401-1. This current flow causes a voltage across the capacitor 410 to increase until the capacitor voltage reaches target turn-on threshold voltage level across the capacitor 410 which represents a clamping voltage (i.e., Zener voltage of Zener diode 420). In other words, the Zener voltage of the Zener diode 420 limits the maximum level of the self-bias turn-on threshold voltage ($V_{GS}$) which is generated to turn on the first and second solid-state switches 401 and 402.

In this exemplary embodiment, the target threshold voltage level is limited by the Zener voltage (i.e., reverse breakdown voltage) of the Zener diode 420 such that the Zener diode 420 serves as a solid-state clamp to limit the turn-on threshold voltage. In this regard, the self-bias turn-on threshold voltage control mode is input-line voltage independent, as the level of the self-bias turn-on threshold voltage is limited by the solid-state clamp. During a positive half cycle of AC supply voltage waveform of the AC mains 10, the diode 242, the resistor 252, and the capacitor 410 will trickle charge across the Zener diode 420 to maintain the turn-on threshold voltage (i.e., the Zener voltage) for the first and second solid-state switches 401 and 402.

As noted above, in the exemplary mode control framework of FIG. 4, the solid-state switch 401 is maintained in a switched-off state for a sufficient period of time to charge the capacitor 410 to the Zener voltage of the Zener diode 420. In some embodiments, the Zener voltage is about 15 V, and the turn-on threshold voltage of the solid-state switches 401 and 402 is in a range of about 10 V to about 15 V. If the solid-state switch 401 turns on prematurely before reaching the clamping voltage of the Zener diode due to, e.g., leakage, Miller capacitance of the MOSFET device, etc., the solid-state switch 401 can actually turn on with less than 2 V of gate-to-source voltage, which would prevent the capacitor 410 from being charged enough to generate a capacitor voltage which corresponds to the clamping voltage of the Zener diode 420. In this regard, the self-bias turn-on threshold voltage control mode is configured to maintain the first control switch 460 turned-on for a period of time which is sufficient keep the first and second solid-state switches 401 and 402 turned-off and thereby allow the capacitor 410 to be charged to the clamping voltage of the Zener diode 420.

As noted above, the mode control circuit 405 implements a forced turn-off control mode using the circuit components 440, 470 and 480. In particular, during operation of the solid-state circuit interrupter 400, the switch 470 can be activated by one of the sensors 480 to effectively shunt the gate-to-source terminals and turn-off the solid-state switches 401 and 402. The sensors 480 can include one or more of various types of sensors. For example, in some embodiments, the sensors 480 include a current sensor which is configured to measure a voltage drop across the sense resistor 440 and determine a magnitude of current flowing in the hot line path between the line hot 11 and the load hot 21 based on the measured voltage drop across the current sense resistor 440. In some embodiments, the sense resistor 440 has a resistance value that is less than 1 milli-Ohm. As such, the voltage potential across the sense resistor 440 is negligible but yet sufficient for current sensing. A difference between ground potential of the sense resistor 440 and the sensing circuit is small and will be mutually compensated due to the bi-directional current flow through the sense resistor 440.

In other embodiments, the sensors 480 include one or more sensors that are configured to sense environmental conditions. For example, the sensors 480 can include one or more of (i) a chemical sensitive detector that is configured to detect the presence of hazardous chemicals, (ii) a gas sensitive detector that is configured to detect the presence of hazardous gases, (iii) a temperature sensor that is configured to detect high temperatures indicative of, e.g., a fire; a (iv) a piezoelectric detector that is configured to detect large vibrations associated with, e.g., explosions, earthquakes, etc., (v) a humidity sensor or water sensor that is configured to detect floods or damp conditions, and other types of sensors that are configured to detect for the presence or occurrence of hazardous environmental conditions that would warrant circuit interruption.

In some embodiments, the switch 470 comprises a optical transistor (e.g., phototransistor, etc.) or other types of optical switches, which receives signals from a complementary light emitting diode (LED) that is controlled by a sensor device or microcontroller. This optical coupling between the sensors 480 and the switch 470 essentially provides galvanic isolation between the force turn-off control circuitry and the switching circuit of the solid-state circuit interrupter 400. In other embodiments, galvanic isolation can be implemented using magnetic, capacitive, or radio frequency (RF) isolation technologies.

In other embodiments, the switch 470 can be activated in response to remote commands (e.g., alarm signals) received from a local or remote controller that is configured to detect faults, or remote commands received from an individual that can control operation of the solid-state circuit interrupter 400 through smart technologies implemented using, for example, an IoT wireless computing network, wherein the solid-state circuit interrupter 400 comprises a smart wireless IoT device.

Figure 5:
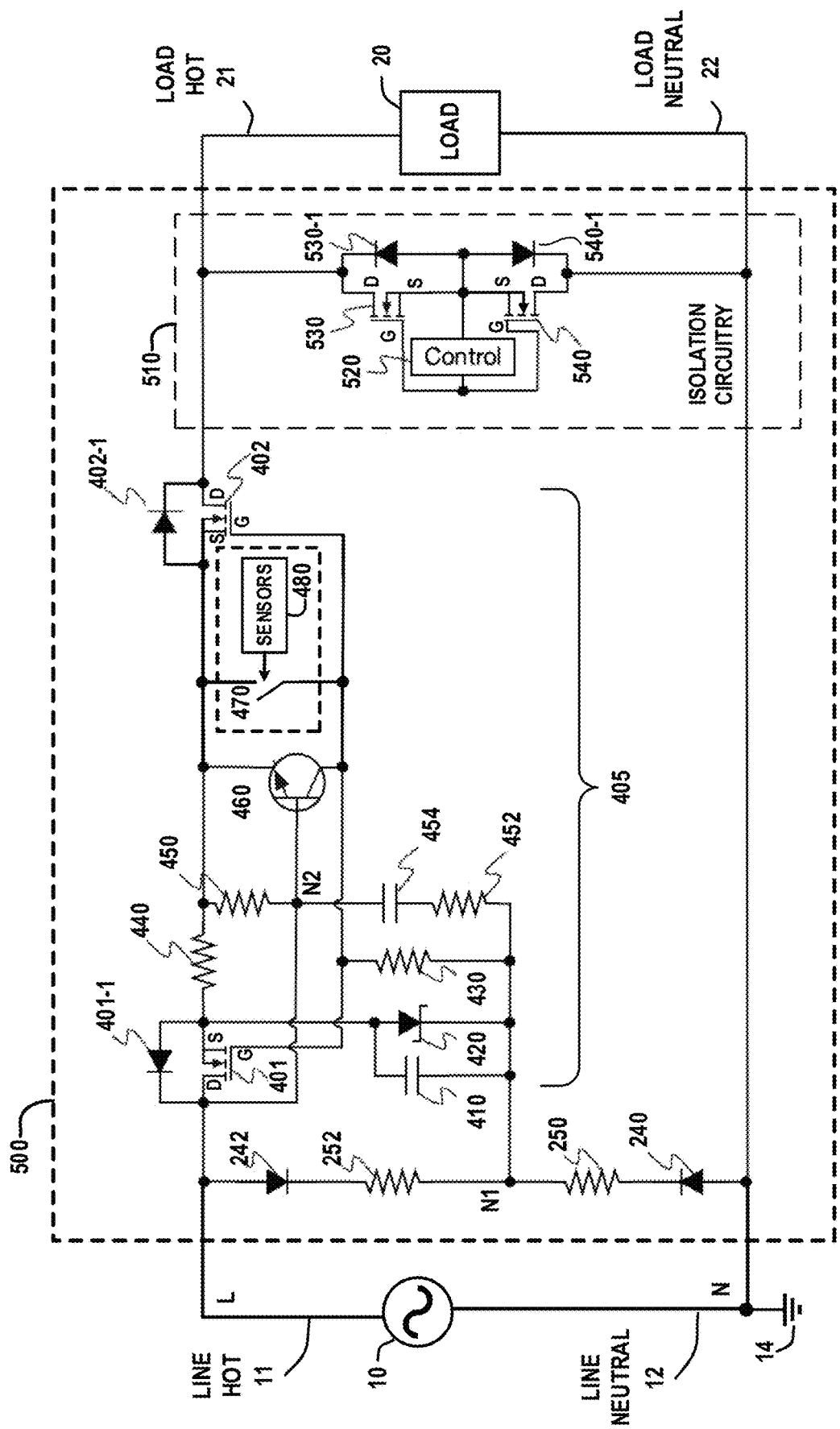
FIG. 5 schematically illustrates a solid-state circuit interrupter according to another embodiment of the disclosure.

FIG. 5 schematically illustrates a solid-state circuit interrupter according to another embodiment of the disclosure. In particular, FIG. 5 schematically illustrates a solid-state circuit interrupter 500 which is similar to the solid-state circuit interrupter 400 of FIG. 4, except that the solid-state circuit interrupter 500 comprises isolation circuitry 510 to provide galvanic isolation between the solid-state circuit interrupter 500 and the load 20 when the solid-state switches 401 and 402 are turned off. When the solid-state switches 410 and 402 are turned-off, the solid-state switches 401 and 402 can generate a small amount of leakage current. For example, even when the solid-state switches 401 and 402 are biased to be in a completely switched-off state, a small amount of leakage current (e.g., 200 uA) can flow through the solid-state switches 401 and 402 and generate a sizable voltage drop across the load 20 when the load 20 comprises a high impedance load.

The isolation circuit 510 serves to shunt the load 20 from unwanted leakage current flow from the AC mains 10 though the switched-off solid-state switches 401 and 402. The isolation circuit 510 comprises a controller 520, MOSFET devices 530 and 540 and associated body diodes 530-1 and 540-1. During a turn-off period of the solid-state switches 401 and 402, the controller 520 commands the MOSFET switches 530 and 540 to turn on and thereby shunt the unwanted leakage and prevent such leakage current from flowing into the load 20. The effect of bypassing or shunting leakage current away from the load 20 serves as an equivalent to a galvanic isolation technique which implements with an air-gap between the AC mains 10 and the load 20. In this configuration, the isolation circuitry 510 serves as a pseudo air-gap.

Figure 6:
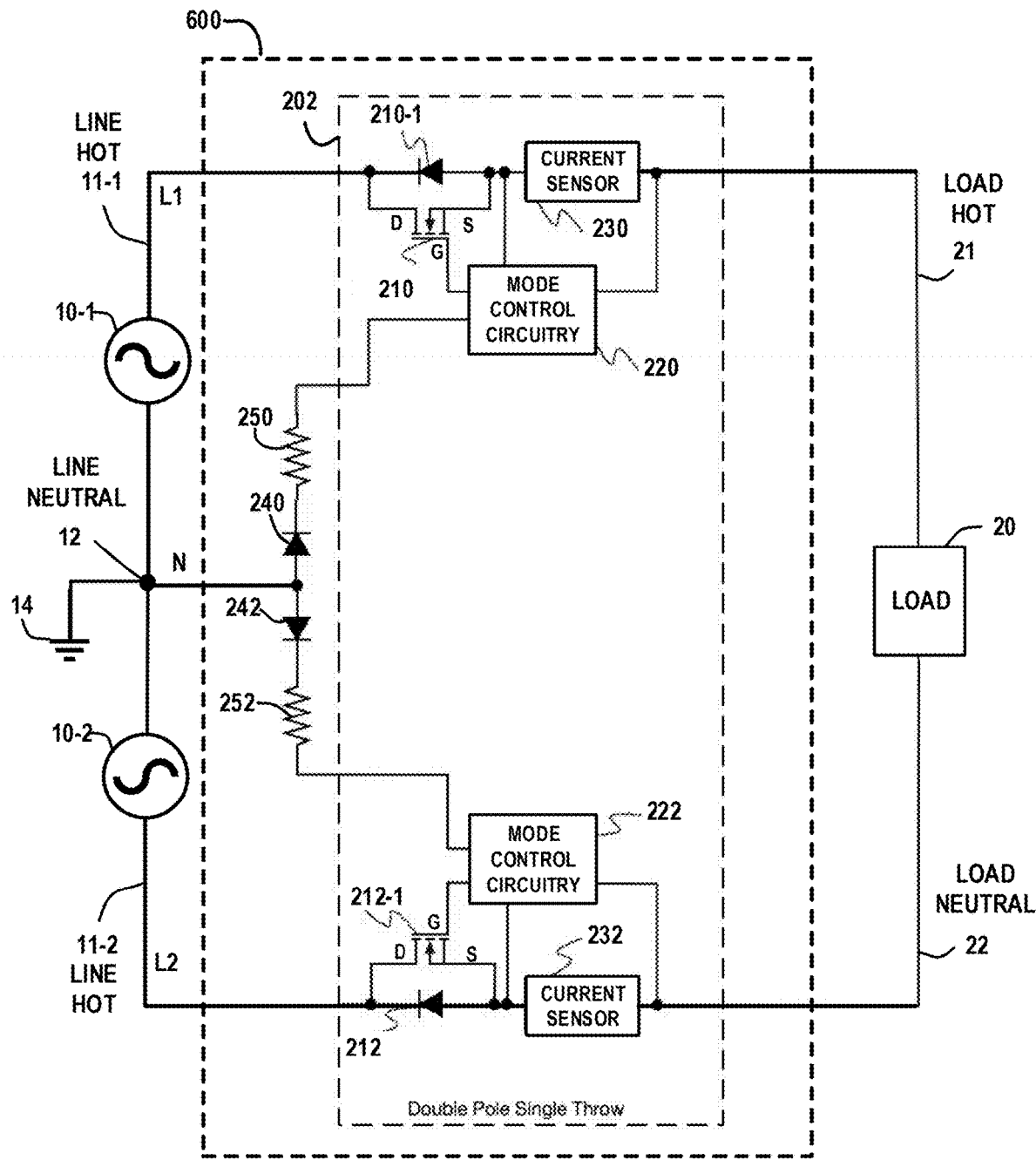
FIG. 6 schematically illustrates a solid-state circuit interrupter according to another embodiment of the disclosure.

FIG. 6 schematically illustrates a solid-state circuit interrupter according to another embodiment of the disclosure. In particular, FIG. 6 schematically illustrates a solid-state circuit interrupter 600 which is similar to the solid-state circuit interrupter 200 of FIG. 2, except that the solid-state switches 210 and 212 of the DPST switching circuit 202 are coupled to the respective line hot lines 11-1 and 11-2 of two separate hot phases 10-1 and 10-2 of the AC mains 10, wherein the hot phases 10-1 and 10-2 are 180 degrees out of phase. In this configuration, the first branch circuit comprising the diode 240 and the resistor 250 are serially connected between the line neutral 12 and the first mode control circuit 220, and the second branch circuit comprising the diode 242 and the resistor 252 are serially connected between the line neutral 12 and the second mode control circuit 222. The mode control circuits 220 and 220 can be implement using the circuit architectures and mode control techniques as discussed above in conjunction with FIGS. 3, 4 and 5.

Figure 7:
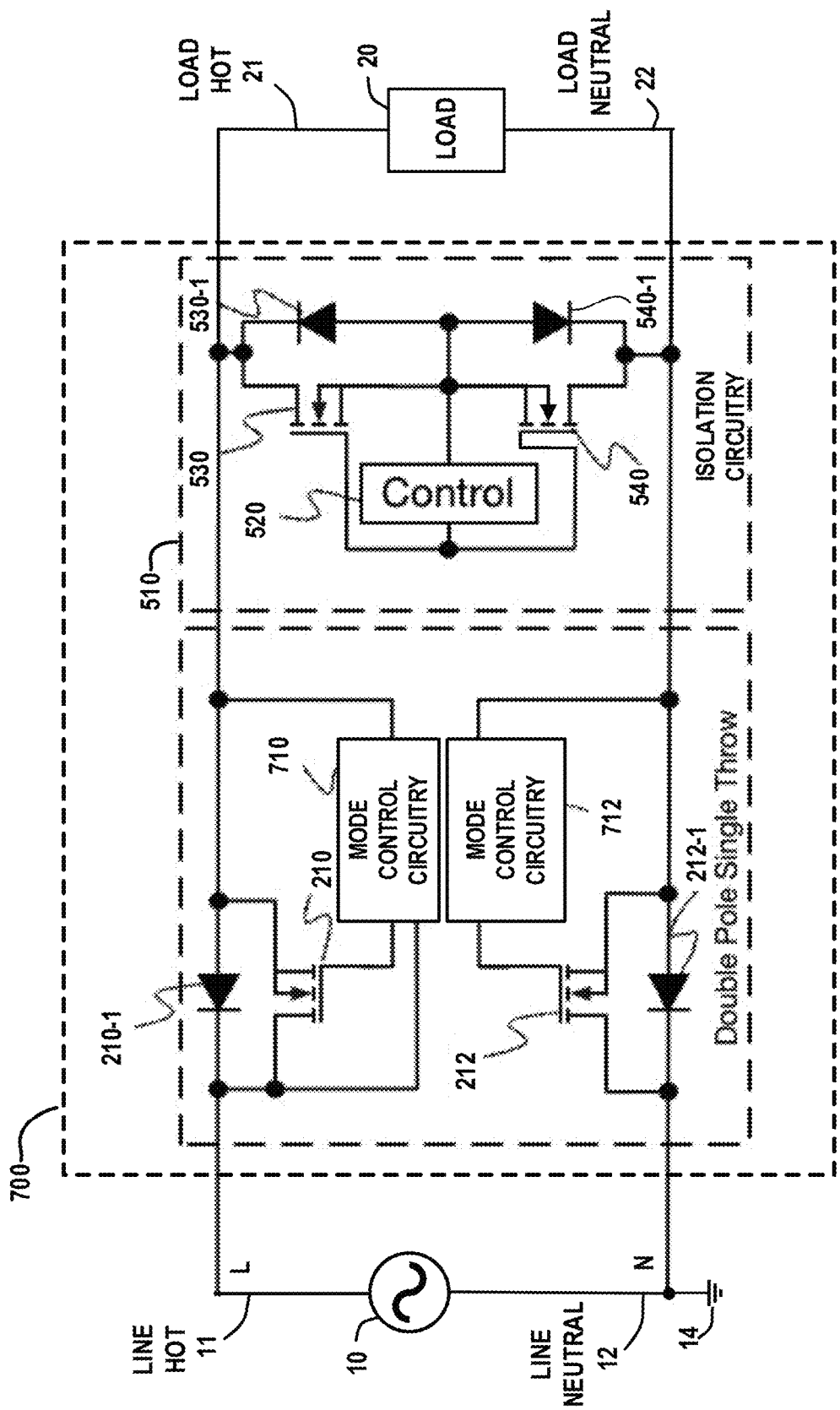
FIG. 7 schematically illustrates a solid-state circuit interrupter according to another embodiment of the disclosure.

FIG. 7 schematically illustrates a solid-state circuit interrupter according to another embodiment of the disclosure. In particular, FIG. 7 schematically illustrates a solid-state circuit interrupter 700 which is similar to the solid-state circuit interrupter 200 of FIG. 2, except that the solid-state circuit interrupter 700 omits the current sensors 230 and 232 shown in FIG. 2, and further includes the isolation circuitry 510 as in the exemplary embodiment of FIG. 5. The isolation circuitry 510 shunts the leakage current, which is generated by the solid-state switches 210 and 212 in their switched-off states, and thereby prevents the leakage current from flowing through the load 20. As noted above, the effect by bypassing or shunting leakage current away from the load 20 serves as an equivalent to galvanic isolation.

While the explicit current sensors 230 and 232 are omitted in the solid-state circuit interrupter 700, a fault detection sensor within one or both of the mode control circuits 710 and 712 can utilize the internal drain-source resistance ($R_{DS}$-ON) of the solid-state switches 210 and 212 to determine an amount of current flow in the line hot or line neutral legs, and then deactivate the switches 210 and 212 in response to the detection of fault conditions (e.g. short-circuit or over-current faults), and activate the isolation circuit 510 to shunt leakage current from the load 20 during the time when the solid-state switches 210 and 212 are maintained in a switched-off state.

In some embodiments, the mode control circuits 710 and 712 can implement a self-bias turn-on threshold voltage mode utilizing a free-standing isolated AC-DC power supply with floating voltage output that serves as a turn-on threshold voltage to bias the solid-state switches 210 and 212. In other embodiments, a self-bias turn-on threshold voltage mode can be implemented using galvanic isolation devices such as capacitive, RF, and optical isolation devices.

Figure 8:
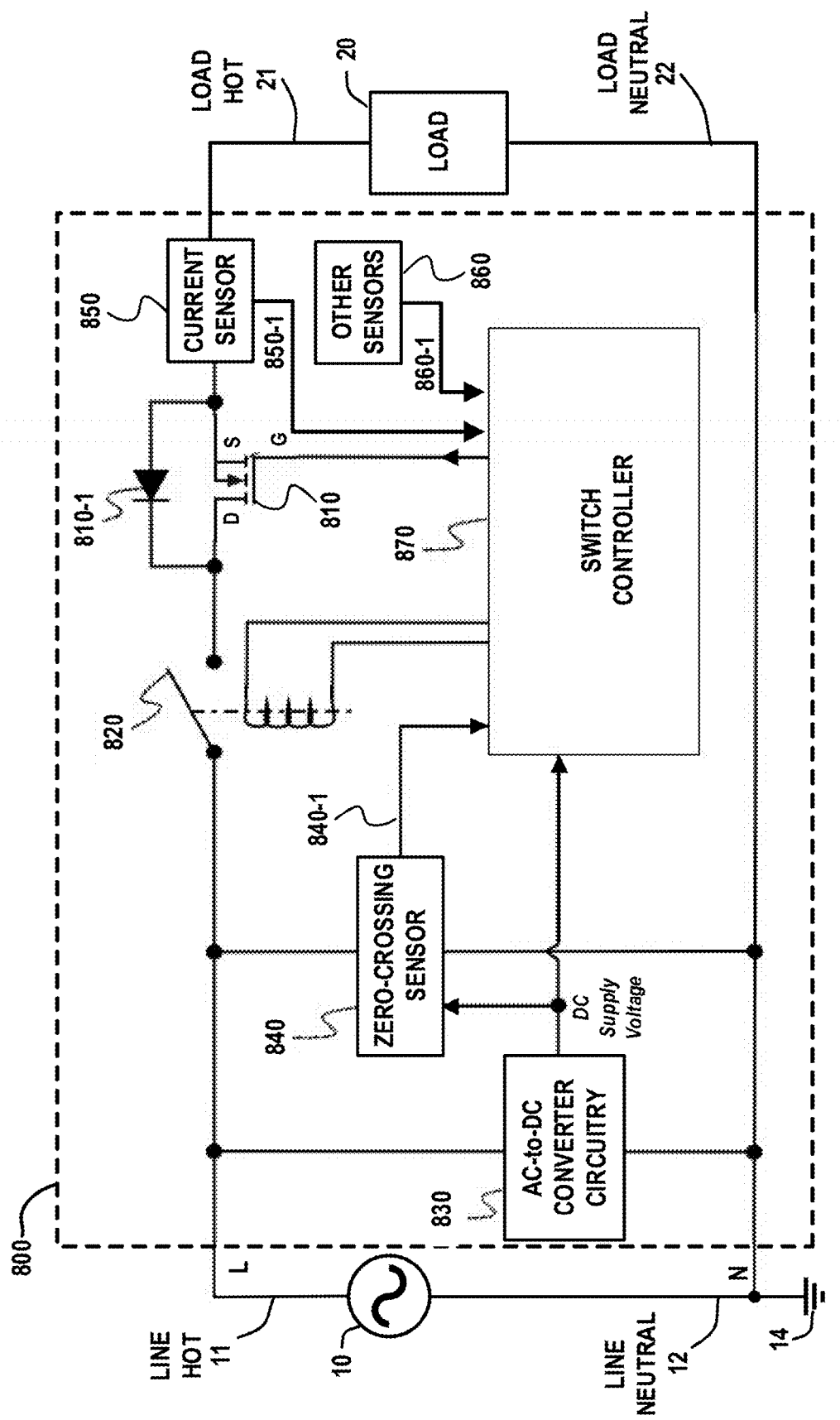
FIG. 8 schematically illustrates a solid-state circuit interrupter according to another embodiment of the disclosure.

FIG. 8 schematically illustrates a solid-state circuit interrupter according to another embodiment of the disclosure. In particular, FIG. 8 schematically illustrates a solid-state circuit interrupter 800 connected between an AC mains 10 and a load 20, wherein the solid-state circuit interrupter 800 comprises a single pole hybrid solid-state and mechanical circuit interrupter architecture. The solid-state circuit interrupter 800 comprises a solid-state switch 810 and an air-gap electromagnetic switch 820 connected in series in an electrical path between the line hot 11 of the AC mains 10 and the load hot 21 of the load 20 (e.g., the air-gap electromagnetic switch 820 and the solid-state switch 810 are connected in series between a line input terminal and a load output terminal of the solid-state circuit interrupter 800). The solid-state circuit interrupter 800 further comprises an AC-to-DC converter circuit 830, a zero-crossing sensor 840, a current sensor 850, other types of sensors 860 (e.g., environmental sensors, light sensors, etc.), and a switch controller 870.

In some embodiments as shown in FIG. 8, the solid-state switch 810 comprises a power MOSFET switch 810 (e.g., N-type enhancement MOSFET device) having gate terminals (G), drain terminals (D), and source terminals (S) as shown, and an intrinsic body diode 810-1. The air-gap electromagnetic switch 820 comprises any suitable type of electromagnetic switch mechanism which is configured to physically open and close a set of electrical contacts, wherein an air gap is created between the electrical contacts when the air-gap electromagnetic switch 820 is in a switched-open state. For example, the air-gap electromagnetic switch 820 may comprise a latching solenoid or relay element that is responsive to control signals from the switch controller 870 to automatically open or close the electrical contacts of the air-gap electromagnetic switch 820.

The creation of an air gap in the line path between the line hot 11 and load hot 21 provides complete isolation of the AC mains 10 from the load 20, as it prevents the flow of current from the line hot 11 to the load hot 21. The air-gap electromagnetic switch 820 may be disposed on either the line side (as shown in FIG. 8) of the solid-state switch 810 or on the load side of the solid-state switch 810. The solid-state circuit interrupter 800 provides a cost-effective solution which allows one solid-state switch to be utilized (as compared to several solid-state switches in the exemplary embodiments described above) in an instance where electrical codes require the implementation of an air-gap in the circuit interrupter for complete isolation.

The AC-to-DC converter circuitry 830 is configured to provide DC supply power to various circuitry and elements of the sold-state circuit interrupter 800 including the zero crossing sensor 840, the switch controller 860, and optionally the current sensor 850 and other sensors 860 (depending on the configuration of such sensors 850 and 860). The AC-to-DC converter circuitry 830 is configured to remain powered during faults when the switches 810 and 820 are respectively switched-Off and switched-Open states. In some embodiments, the AC-to-DC converter circuitry 830 comprises sufficient storage capacitance to power the DC subsystems immediately following a utility outage such that relevant power outage or short-circuit information may be obtained and stored by the switch controller 870 as the utility power collapses, and then wirelessly transmitted to a remote node, device, or system using a radio frequency transceiver (not shown) which is either coupled to the switch controller 870 or integrated with the switch controller 870.

The zero-crossing sensor 840 is configured to monitor the voltage and/or current at a target point along the hot line path through the solid-state circuit interrupter 800 and detect zero current and/or zero voltage crossings of the AC supply voltage waveform of the AC mains 10. For example, as shown in FIG. 8, the zero-crossing sensor 840 is coupled to the hot line path upstream of the switches 820 and 810 to detect instances of zero current and/or zero voltage crossings of the AC power supply waveform of the AC mains 10 on the line input of the solid-state circuit interrupter 800. The zero-crossing sensor 840 is coupled to the switch controller 870 by one or more data acquisition and control lines 840-1. The zero-crossing sensor 840 can be implemented using any suitable type of zero voltage and/or zero current sensing circuitry that is configured to sense zero crossings of current and or voltage of the AC power supply waveform and generate a detection signal that indicates a zero-crossing event and an associated direction of the current or voltage (e.g., transitioning from negative to positive, or from positive to negative). In this regard, the zero-crossing sensor 840 is configured to receive as input an AC waveform, compare the input AC waveform to a zero reference voltage (e.g., line neutral voltage), and detect the AC waveform transition from positive and negative, which coincides when the AC waveform crosses the zero reference voltage. The zero-crossing detector will transition between a logic "1" and logic "0" output upon each detected zero crossing of the AC voltage waveform.

The current sensor 850 is configured to detect a magnitude of current being drawn by the load 20 in the hot line path through the solid-state circuit interrupter 800. The current sensor 850 can be implemented using any suitable type of current sensing circuit including, but not limited to, a current-sensing resistor, a current amplifier, a Hall Effect current sensor, etc. The current sensor 850 is coupled to the switch controller 870 by one or more data acquisition and control lines 850-1.

The sensors 860 include one or more optional sensors that are configured to detect for possible hazardous environmental conditions (e.g., chemical, gas, humidity, water, temperature, light, etc.) and generate sensor data that is indicative of potentially hazardous environmental conditions. The sensors 860 are coupled to the switch controller 870 by one or more data acquisition and control lines 860-1.

The switch controller 870 operates in conjunction with the zero-crossing sensor 840, the current sensor 850 and the sensors 860 to perform functions such as detecting fault conditions (e.g., short-circuit faults, over-current faults, arc faults, ground faults, etc.), detecting hazardous environmental conditions (e.g., gas leaks, chemical spills, fire, floods, etc.), and to provide timing control for the opening and closing of the switches 810 and 820 in response to detected fault conditions or hazardous environmental conditions, to thereby avoid creating electrical arcs in the air-gap electromagnetic switch 820. The switch controller 870 generates gate control signals that are applied to the gate terminal (G) of the solid-state switch 810 to place the solid-state switch 810 into a switched-on or a switched-off state. In some embodiments, the switch controller 870 generates a gate control signal to place the solid-state switch 810 into a switched-off state in response to fault conditions such as short-circuit faults, over-current faults, and other faults or hazards that are detected by the switch controller 870 as a result of analyzing sensor data obtained from the current sensor 850 and/or the other sensors 860.

The switch controller 870 can be implemented using a processor that is configured to process sensor data and implement switch control timing protocols as discussed herein for controlling the switches 810 and 820. In addition, the switch controller 870 can implement circuitry for converting the sensor data into proper formats that are suitable for processing by the processor. The switch controller 870 can include an RF transceiver to wirelessly communicate with a remote node, device, system, etc., to support remote monitoring and detection of fault conditions and receiving remote commands for controlling the solid-state circuit interrupter 800. The processor may comprise a central processing unit, a microprocessor, a microcontroller, an application-specific integrated circuit (ASIC), a field programmable gate array (FPGA), and other types of processors, as well as portions or combinations of such processors, which can perform processing functions based on software, hardware, firmware, etc. In other embodiments, the solid-state circuitry of the various components (e.g., 830, 840, and 870) of the circuit interrupter 800 can be implemented on a single die as a system-on-chip.

To prevent the generation of electrical arcs between the electrical contacts of the electromagnetic switch 820, the switch controller 870 is configured place the solid-state switch 810 into a switched-off state before placing the air-gap electromagnetic switch 820 into a switched-open or switched-closed state. However, in the configuration of FIG. 8, even when the solid-state switch 810 is in a switched-off state, and assuming the air-gap electromagnetic switch 820 is in a switched-closed state, the body diode 810-1 of the solid-state switch 810 will allow negative current to conduct from the load 20 to the AC mains 10 when the AC power supply waveform of the AC mains 10 is in a negative half-cycle (i.e., when the line hot 11 is negative and the line neutral 12 is positive). Indeed, in this configuration, during a negative half-cycle, the body diode 810-1 is in a forward-biased state, which allows negative current to flow from the load 20 to the AC mains 10, even when the solid-state switch 810 is in a switched-off state.

In this instance, if the air-gap electromagnetic switch 820 is opened during the negative half cycle of the AC power supply waveform, the flow of negative current would generate electrical arcs between the electrical contacts of the air-gap electromagnetic switch 820. To avoid creating such electrical arcs, the switch controller 870 is configured to configured to place the solid-state switch 810 in a switched-off state and then track sensor data obtained from the zero-crossing sensor 840 to determine the polarity of the AC voltage and/or current on the line side (e.g., line hot 11) of the solid-state interrupter 800, and open the air-gap electromagnetic switch 820 when the polarity of the AC voltage and/or current on the line side is determined to be positive (e.g., the AC supply voltage waveform is in a positive half cycle). When the switch controller 870 determines, at a given time, that the polarity of the AC voltage and/or current on the line side is negative (e.g., the AC supply voltage waveform is in a negative half cycle), the switch controller 870 will not open the air-gap electromagnetic switch 820, but rather defer opening the air-gap electromagnetic switch 820 until the next instance of a positive transition zero crossing as detected by the zero-crossing sensor 840. The switch timing control implemented by the switch controller 870 will now be discussed in further detail with reference to FIGS. 9A, 9B and 10.

FIG. 9A illustrates a power supply voltage waveform that is input to a line side of the solid-state circuit interrupter 800 of FIG. 8. In particular, FIG. 9A, illustrates an input voltage waveform 900 which represents a power supply voltage waveform of the AC mains 10. The input voltage waveform 900 comprises positive half cycles 902, negative half cycles 904, and zero voltage crossings 910 at times T0, T1, T2, T3, and T4. When the solid-state switch 810 is in switched-on state and the air-gap electromagnetic switch 820 is in switched-closed state, the input voltage waveform 900 is applied to the load hot line 21 of the load 20. When the switch controller 870 determines that power should be disconnected from the load 20, the switch controller 870 will generate a gate control signal that is applied to the gate terminal G of the solid-state switch 810 to place the solid-state switch 810 into a switched-off state.

FIG. 9B illustrates an output voltage waveform 920 on a load side of the solid-state circuit interrupter 800 of FIG. 8 when the solid-state switch 810 is in a switched-off state and the air-gap electromagnetic switch 820 is in a switched-closed state. In this state, the body diode 810-1 of the solid-state switch 810 is forward biased during the negative half cycles 904 of the input voltage waveform 900, which rectifies the input voltage waveform 900 and results in the output voltage waveform 920 shown in FIG. 9B wherein portions 922 of the output voltage waveform 920 which correspond to the positive half cycles 902 of the input waveform 900 are at 0V, and wherein portions 924 of the output voltage waveform 920 track the voltage of the negative half cycles 904 of the input waveform 900. In this instance, negative current would flow from the load 20 to the AC mains 10 during each negative half cycle 924 until the air-gap electromagnetic switch 820 was opened.

As noted above, after the solid-state switch 810 is switched-off, the switch controller 870 will process sensor data received from the zero-crossing sensor 840 to determine when there is little or no current flow in the line hot path, and then generate a control signal to open the air-gap electromagnetic switch 820 to fully disconnect power to the load 20, while preventing or otherwise mitigating possible electrical arc formation in the air-gap switch 820.

For example, assume that the solid-state switch 810 is switched-off in the time period between T0 and T1 in FIGS. 9A and 9B. In this example, the switch controller 870 would detect that the next zero voltage crossing of the input waveform 900 is a negative transitioning zero voltage crossing 910 at time T1, and then wait for the next positive transitioning zero voltage crossing 910 at time T2 before deactivating the air-gap electromagnetic switch 820 to ensure that no current is flowing in the line hot path between the load 20 and AC mains 10 when the air-gap electromagnetic switch 820 is opened.

It is to be understood that the exemplary voltage waveforms 9A and 9B represent a load 20 having a power factor of about one (1) where is it is assumed that AC voltage waveform and the current drawn by the load 20 are in phase. In such instance, the zero voltage crossings are assumed to be zero current crossings. However, in instances where the load 20 has a power factor that is less than 1 (e.g., capacitive or inductive load), the voltage waveform and current drawn by the load 20 will be out of phase. In this regard, the zero-crossing sensor 840 can include a zero current crossing detector to determine zero current crossings, or positive transitioning zero current crossings, of a current waveform on the line side of the switches 820 and 810 to ensure that no positive current is flowing in the line hot path before opening the air-gap electromagnetic switch 820.

Figure 10:
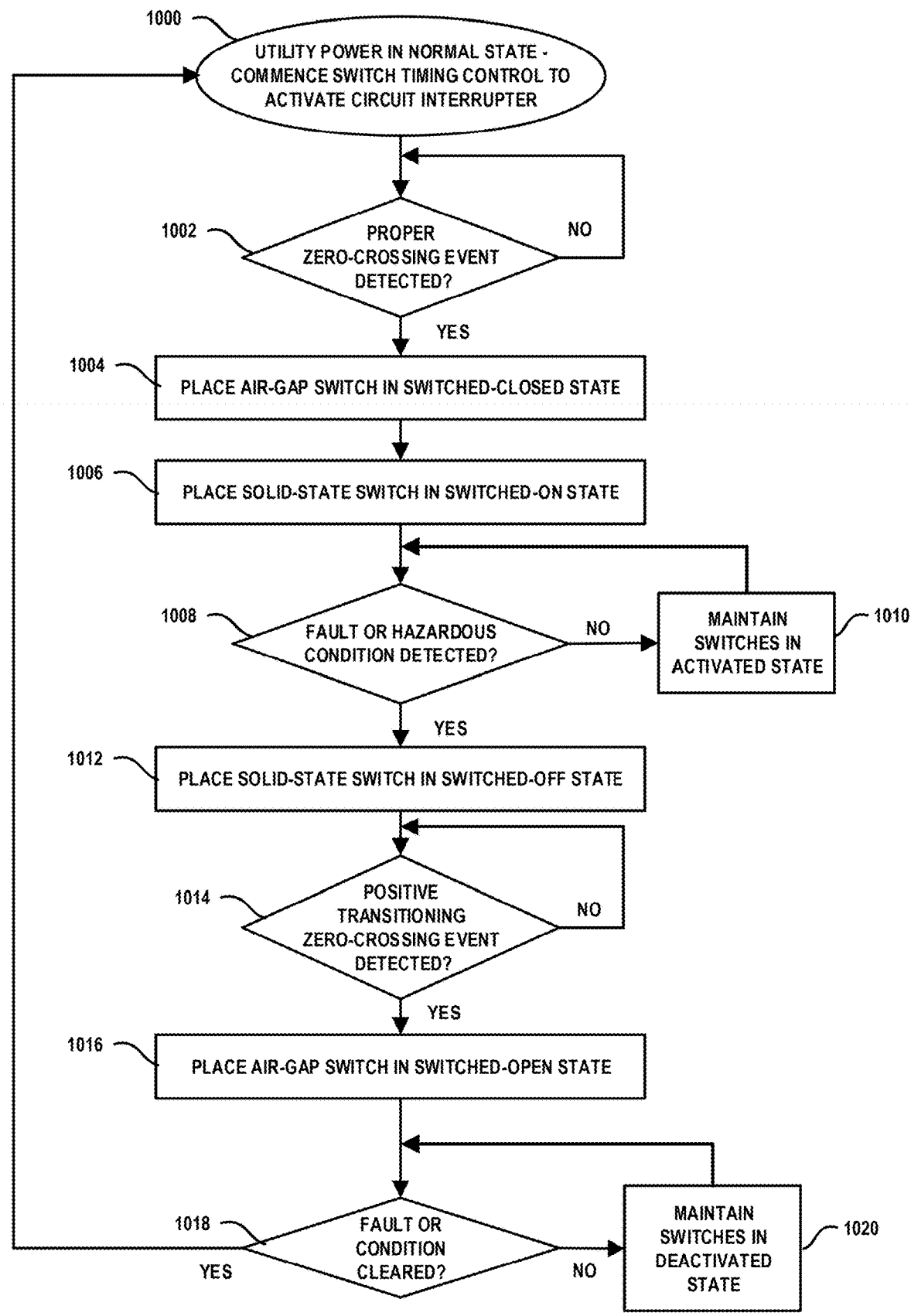
FIG. 10 is a flow diagram of a switch control process which is implemented by a switch controller of the solid-state circuit interrupter of FIG. 8, according to an embodiment of the disclosure.

FIG. 10 is a flow diagram of a switch control process which is implemented by the switch controller 870 of the solid-state circuit interrupter 800 of FIG. 8, according to an embodiment of the disclosure. The switch control process of FIG. 10 represents a non-limiting exemplary embodiment for recovery of utility power or a manual, automatic, or remote activation control to activate the solid-state interrupter 800 (block 1000). In this example, it is assumed that the solid-state switch 810 is in a switched-off state, and the air-gap electromagnetic switch 820 is in a switched-closed state.

The switch controller 870 waits to detect a proper zero crossing (block 1002) before closing the air-gap electromagnetic switch 820 (block 1004). While it is ideal to wait for a voltage and/or current zero cross event prior to closing the air-gap electromagnetic switch 820, one of ordinary skill in the art will understand that this is not a mandatory condition for closure. The zero-crossing event can be a positive transitioning zero-crossing event or a negative transitioning zero-crossing event. As noted above, in some embodiments, it is preferable to close the air-gap electromagnetic switch 820 at the zero-crossing of an upcoming half cycle in which the body diode (e.g., diode 810-1) of the solid-state switch (e.g., switch 810) is not forward biased and conducting. For example, in the exemplary embodiment of FIG. 8, the body diode 810-1 of the solid-state switch 810 is reversed biased and nonconducting during positive half cycles of the supply voltage waveform of the AC mains 10. In such embodiment, it is ideal to place the air-gap electromagnetic switch into a switched-closed state (block 1004) upon detecting a positive transitioning (current or voltage) zero-crossing event. In other embodiments, depending on the type of MOSFET being used for the solid-state switch and associated body diode, it may be ideal to close the solid-state switch upon detecting a negative transitioning (current or voltage) zero-crossing event.

When the air-gap electromagnetic switch 820 is closed, the switch controller 870 will proceed to generate a gate control signal to place the solid-state switch 810 into a switched-on state (block 1006). The solid-state switch 810 may be switched-on at any time after the air-gap electromagnetic switch 820 is closed. For example, the solid-state interrupter circuit 800 may operate in a "stand-by" mode where the air-gap electromagnetic switch 820 is maintained in switched-closed state, and the switch controller 870 waits for the occurrence of some triggering event (e.g., remote command) to proceed with activating the solid-state switch 810.

When both switches 810 and 820 are activated, the switch controller 870 will enter a waiting state for some event or command to interrupt the circuit connection between power and load (block 1008). During the waiting period, the solid-state switch 810 and the air-gap electromagnetic switch 820 will be maintained in a activated state (block 1010). The event can be the detection of a given fault condition or hazardous condition as determined by the switch controller 870 processing sensor data received from the various sensors 850 and 860. The command can be a manual command or automated command to interrupt the circuit connection.

Upon detecting a fault or hazardous condition (affirmative determination in block 1008) or in response to a manual or automated command to interrupt the circuit, the switch controller 870 will generate a gate control signal to place the solid-state switch 810 into a switched-off state (block 1012). The switch controller 870 will then proceed to process data from the zero-crossing sensor 840 to detect a target zero-crossing event (e.g., a positive transitioning zero-crossing event) on the line hot path (block 1014), and in response to detecting the target zero-crossing event (affirmative determination in block 1014), the switch controller 870 will generate a switch control signal to place the air-gap electromagnetic switch 820 into a switched-open state (block 1016).

The switch controller 870 will enter a wait state (block 1018) to wait for the fault event or hazardous condition to be cleared, and maintain the solid-state and air-gap electromagnetic switches in a deactivate state (block 1020). When the fault event or hazardous condition is cleared (affirmative determination in block 1018), or when the switch controller 870 otherwise receives a manual or remote command indicating to reconnect power to the load, the control process returns to block 1000, wherein the switch controller 870 proceeds to reactivate the air-gap and solid-state switches and, thereby reconnect the power supply to the load. It is to be understood that while the process flow of FIG. 10 does not explicitly include process steps for performing zero-crossing detection prior to opening and closing the solid-state switch 810, one of ordinary skill in the art will recognize and appreciate that for certain applications, the switching on and off of the solid-state switch 810 may be timed with either a voltage or current zero-crossing event, as desired.

Figure 11A:
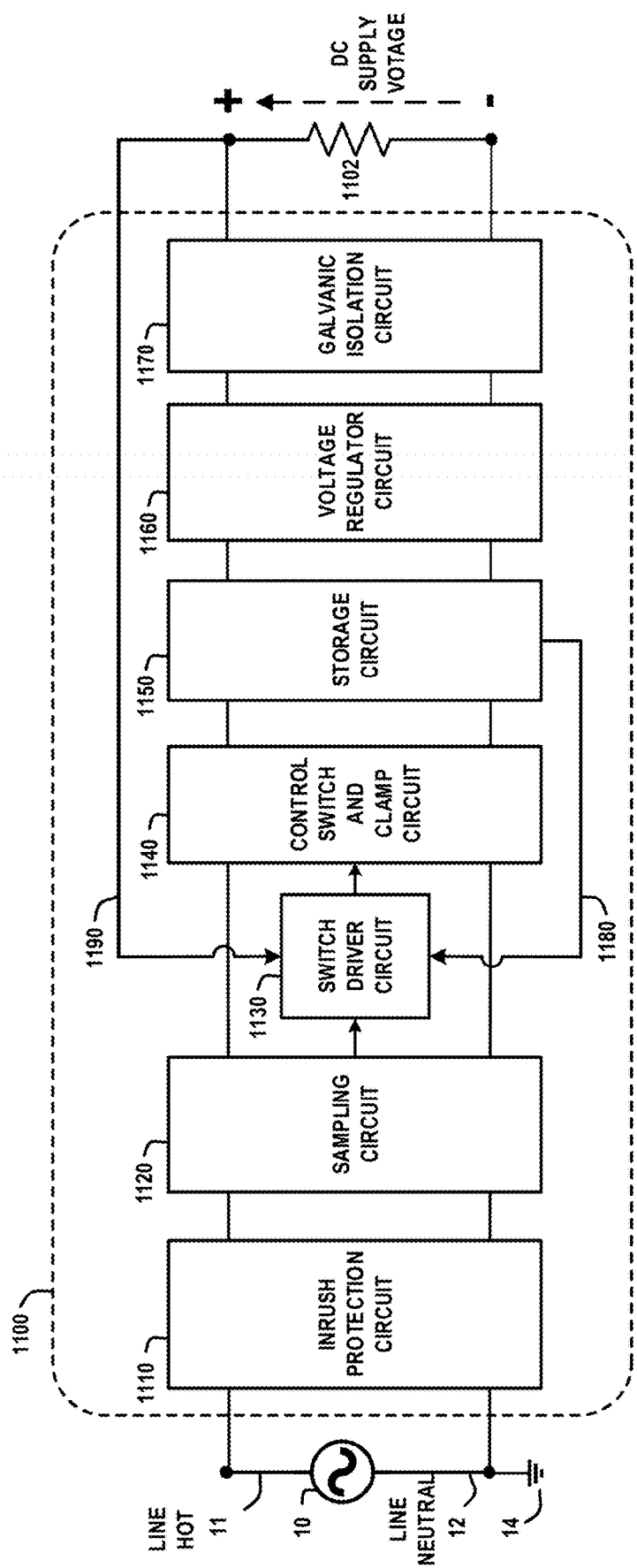
FIG. 11A is a schematic block diagram of an AC-to-DC converter circuit which can implemented in the solid-state circuit interrupter of FIG. 8, according to an embodiment of the disclosure.

FIG. 11A is a schematic block diagram of an AC-to-DC converter circuit 1100 which can implemented in the solid-state circuit interrupter 800 of FIG. 8, according to an embodiment of the disclosure. The AC-to-DC converter circuit 1100 comprises an architecture which does not require a rectifier to generate DC voltage. The AC-to-DC converter circuit 1100 comprises an inrush protection circuit 1110, a sampling circuit 1120, a switch driver circuit 1130, a control switch and clamp circuit 1140, a storage circuit 1150, a voltage regulator circuit 1160, and a galvanic isolation circuit 1170. The AC-to-DC converter circuit 1100 generates a DC supply voltage that is applied to load circuitry 1102.

The inrush protection circuit 1110 is configured to limit the magnitude of input current to the AC-to-DC converter circuit 1100. The sampling circuit 1120 is configured to sample the AC supply voltage waveform of AC mains 110. The sampling circuit 1120 outputs sampled voltages to the switch driver circuit 1130. The switch driver circuit 1130 is configured to apply a control voltage to a control switch of the control switch and clamp circuit 1140. The control switch and clamp circuit 1140 is configured to supply power to the storage circuit 1150 in response to the control voltage applied by the switch driver circuit 1130. The storage circuit 1150 comprises a voltage storage element (e.g., capacitor) that is configured to store a DC voltage that is applied to the voltage regulator circuit 1160. The voltage regulator circuit 1160 is configured to generate a regulated DC supply voltage to the load circuitry 1102.

In some embodiments, the switch driver circuit 1130 receives a feedback voltage 1180 from the storage circuit 1150 and generates the control voltage that is applied to the control switch and clamp circuit 1140 based, at least in part, on the feedback voltage 1180. In some embodiments, the feedback voltage 1180 can be eliminated, and the AC-to-DC converter circuit 1100 operates as a feed forward converter in which the storage element of the storage circuit 1150 is controlled from the forward side elements 1120, 1130 and 1140.

In some embodiments, the AC-to-DC converter circuitry 1100 implements a feedback control circuit 1190 from the load circuitry 1102 to the switch driver circuit 1130 to support both feed forward and feedback control. In some embodiment, the balance of feed forward and feedback control is determined by the feedback voltage 1180 and the selection of components in the sampling circuitry 1120. In some embodiments, a balance between feedforward and feedback control is configured according to resistor elements in the sampling circuitry 1120 and the feedback voltage 1180. In other embodiments, variable elements are utilized to enable adjustment of the feedforward and feedback control. In such embodiments, the feedback circuit 1190 would comprise galvanic isolation between the switch driver circuit 1130 and the load circuitry 1102.

Figure 11B:
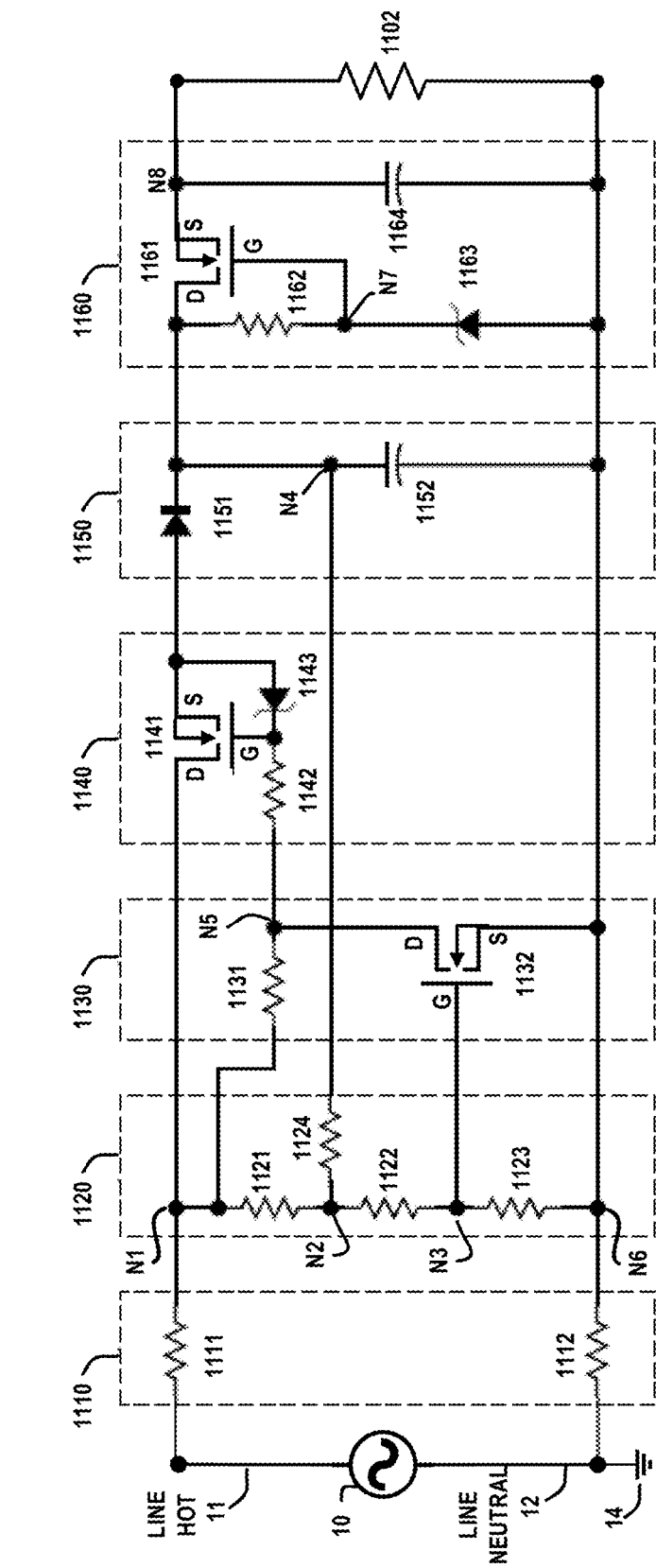
FIG. 11B is a schematic circuit diagram of the AC-to-DC converter circuit of FIG. 11A, according to an embodiment of the disclosure.

FIG. 11B is a schematic circuit diagram of the AC-to-DC converter circuit of FIG. 11A, according to an embodiment of the disclosure. In the exemplary embodiment of FIG. 11B, the inrush protection circuitry 1110 comprises a first input resistor 1111 connected to the line hot 11 of the AC mains 10 and a second input resistor 1112 connected to the line neutral 12 of the AC mains 10. In other embodiments, for high-power and high-efficiency applications, the inrush protection circuitry 1110 comprises switch elements that are configured to allow current to flow through the resistors 1111 and 1112 at startup, and then bypass the resistors 1111 and 1112 once steady state operation is reached. In other embodiments, the inrush protection circuitry 1110 comprises first and second inductor elements in place of the first and second resistors 1111 and 1112.

The sampling circuitry 1120 comprises a plurality of resistors 1121, 1122, 1123, and 1124 which are connected to various nodes N1, N2, N3, and N4 as shown. The resistors 1121, 1122, and 1123 form a voltage divider network for sampling the input AC waveform, wherein the voltage divider network comprises a feedback node N2 and an output node N3. The resistor 1124 is connected between the feedback node N2 and an output node N4 of the storage circuitry 1150 to provide a feedback voltage from the storage capacitor 1152. The switch driver circuitry 1130 comprises a resistor 1131 connected between nodes N1 and N5, and a switch element 1132. The control switch and clamp circuitry 1140 comprises a control switch element 1141, a resistor 1142, and a Zener diode 1143. The storage circuitry 1150 comprises a diode 1151 and a storage capacitor 1152. The voltage regulator circuitry 1160 comprises a switch element 1161, a resistor 1162, a Zener diode 1163, and a capacitor 1164.

In some embodiments, the switch elements 1132, 1141 and 1161 comprise n-type enhancement MOSFET devices with gate G, drain D and source S terminals as shown in FIG. 11B. In other embodiments, the switch elements 1132, 1141 and 1161 may be implemented using bipolar transistors or microelectromechanical switches. As shown in FIG. 11B, the switch element 1143 comprises a gate terminal G connected to the output node N3 of the voltage divider network of the sampling circuitry 1120, a drain terminal D connected to an output node N5 of the switch driver circuitry 1130, and a source terminal S connected to an output node N3 of the inrush protection circuitry 1110. The drain terminal D of the switch element 1132 is coupled to the output node N1 of the inrush protection circuitry 1110 through the resistor 1131.

The control switch 1141 comprises a drain terminal D connected to the output node N1 of the inrush circuitry 1110, a gate terminal G connected to the output node N5 of the switch driver circuitry, and a source terminal S connected to an input (i.e., anode of diode 1151) of the storage circuitry 1150. The Zener diode 1143 is connected between the gate terminal G and source terminal S of the control switch 1141, with a cathode of the Zener diode 1143 connected to the gate terminal G of the control switch 1141 and an anode of the Zener diode 1143 connected to the source terminal S of the control switch 1141.

The switch element 1161 of the voltage regulator circuitry 1160 comprises a drain terminal D connected to the output node N4 of the storage circuitry 1150, a gate terminal G connected to a node N7 between the resistor 1162 and the Zener diode 1163, and a source terminal S connected to an output node N8 of the voltage regulator circuitry 1160. The capacitor 1164 is connected between the output node N8 of the voltage regulator circuitry 1160 and the output node N6 of the inrush protection circuitry 1110.

The resistor 1124 (or sense resistor) is connected between the output node N4 of the storage circuitry 1150 to provide a feedback voltage that is applied to the feedback node N2 of the sampling circuitry 1120 through the feedback resistor 1124. The feedback path provided by the connection of the feedback resistor 1124 between nodes N4 and N2 provides an exemplary embodiment of the feedback voltage 1180 as shown in FIG. 11A, wherein the charge of the storage capacitor 1152 is utilized, in part, to generate a control voltage at the output node N3 of the sampling circuitry 1120 connected to the gate terminal G of the switch element 1132 of the switch driver circuitry 1130.

The switch element 1132 is driven by a gate control voltage generated at the output node N3 of the voltage divider network of the sampling circuitry 1120. The gating of the switch element 1132 controls operation of the control switch 1141 of the switch driver circuitry 1130. The resistance values of the resistors 1121, 1122, 1123, and 1124 are selected such that the voltage on node N3 of the voltage divider network, which is applied to the gate terminal G of the switch element 1132 in the switch driver circuitry 1130, will turn the switch element 1132 ON and OFF and thereby synchronously turn the control switch element 1141 OFF and ON. The control switch element 1141 is thereby driven to output a preselected timed output pulse to charge the storage capacitor 1152.

The peak output current of the control switch 1141 is clamped to a preselected value based on a preselected value of the Zener voltage (i.e., reverse breakdown voltage) of the Zener diode 1143, wherein the maximum gate-to-source voltage ($V_{GS}$) is limited by the Zener voltage of the Zener diode 1143. The pulsed output from the control switch 1141 operates to turn on the diode 1151 and supply charge to the node N4 to charge the storage capacitor 1152. The feedback provided by the resistor 1124 connected between the output node N4 of the storage circuitry 1160 and the feedback node N2 of the sampling circuitry 1120 serves to drive the switch driver circuit 1130 to maintain the storage capacitor 1152 to a constant charge.

The switch element 1132 and control switch 1141 are activated, either opened or closed, in synch with the AC voltage input. The AC-to-DC converter circuit 1100 provides a low voltage output with pulse modulation at the frequency of the incoming AC source. The switches 1132 and 1141 are activated, either opened or closed, at voltages that are near, within the threshold voltages for the switches 1132 and 1141, of the zero crossing of the AC source. The output node N4 of the storage circuitry 1150 is applied to an input of the voltage regulator circuitry 1160 and then the load circuit 1102. The capacitor 1164 provides storage capacity to buffer and thereby smooth the output from the AC-to-DC converter 1100 to the load circuitry 1102.

In summary, the exemplary AC-to-DC converter circuits 1100 as shown in FIGS. 11A and 11B comprise the inrush protection circuit 1110, the voltage sampling circuit 1120, the switch driver circuit 1130, the control switch and clamp circuit 1140, the storage circuit 1150, and the voltage regulator circuit 1160. The selection of components in the voltage sampling circuit 1120 determine the timing of the switch driver 1130. The selection of components of the control switch and clamping circuit 1140 determine a peak voltage and current for out pulses. Power output is controlled by selection of both the peak current and the pulse timing. Feedback from the storage element 1152 through the voltage sampling circuit 1120 is utilized to select the pulse timing. The AC-to-DC converter circuit 1100 operates in sync with the AC voltage waveform of the AC mains 110.

Although exemplary embodiments have been described herein with reference to the accompanying figures, it is to be understood that the invention is not limited to those precise embodiments, and that various other changes and modifications may be made therein by one skilled in the art without departing from the scope of the appended claims.

What is claimed is:

1. A circuit interrupter, comprising:
    a solid-state switch serially connected between a line input terminal and a load output terminal of the circuit interrupter, and configured to be placed in one of (i) a switched-on state to provide an electrical connection in an electrical path between the line input terminal and the load output terminal, and (ii) a switched-off state; and
    a mode control circuit configured to implement a first control mode and a second control mode to control operation of the circuit interrupter;
    wherein in the first control mode, the mode control circuit is configured to (i) utilize current drawn from an input power source applied to the line input terminal of the circuit interrupter to generate a turn-on threshold voltage during power-up of the circuit interrupter, (ii) shunt a control terminal of the solid-state switch during the power-up of the circuit interrupter to maintain the solid-state switch in the switched-off state until the turn-on threshold voltage is generated to a constant voltage level, and (iii) remove the shunt to thereby apply the turn-on threshold voltage at the constant voltage level to the control terminal of the solid-state switch to place the solid-state switch into the switched-on state; and
    wherein in the second control mode, the mode control circuit is configured to shunt the control terminal of the solid-state switch to disrupt the turn-on threshold voltage applied to the control terminal of the solid-state switch and thereby place the solid-state switch into the switched-off state.

2. The circuit interrupter of claim 1, wherein the mode control circuit comprises:
    a self-biasing circuit comprising a voltage clamping circuit and a first control switch;
    wherein the voltage clamping circuit is configured to generate the turn-on threshold voltage during power-up of the circuit interrupter using current drawn from an input power source applied to the line input terminal of the circuit interrupter; and
    wherein in response to activation of the first control switch, the first control switch is configured to shunt gate and source terminals of the solid-state switch to maintain the solid-state switch in the switched-off state until the turn-on threshold voltage is generated to the constant voltage level.

3. The circuit interrupter of claim 2, wherein the voltage clamping circuit comprises a capacitor and a Zener diode connected in parallel.

4. The circuit interrupter of claim 2, wherein the self-biasing circuit comprises a resistor-capacitor (RC) network coupled to a control terminal of the first control switch, wherein the RC network is charged during the power-up of the circuit interrupter using current drawn from the input power source applied to the line input terminal of the circuit interrupter, wherein the RC network is configured to have an RC time constant which corresponds to a time period that is not less than a time period needed to generate the turn-on threshold voltage to the constant voltage level during power-up of the circuit interrupter.

5. The circuit interrupter of claim 2, wherein the self-biasing circuit comprises an operational amplifier having an input connected to the voltage clamping circuit and an output connected to a control terminal of the first control switch, wherein the operational amplifier is configured to control operation of the first control switch by maintaining the first control switch in a switched-on state during generation of the turn-on threshold voltage, and placing the first control switch into a switched-off state after the turn-on threshold voltage is generated.

6. The circuit interrupter of claim 2, wherein the mode control circuit comprises a second control switch which is configured to shunt the gate and source terminals of the solid-state switch and disrupt the turn-on threshold voltage applied to the control terminal of the solid-state switch and thereby place the solid-state switch into a switched-off state, in response to activation of the second control switch.

7. The circuit interrupter of claim 6, further comprising a sensor circuit which is configured to generate a control signal to activate the second control switch in response to the sensor circuit detecting a condition that warrants placing the solid-state switch into the switched-off state.

8. The circuit interrupter of claim 7, wherein the sensor circuit comprises a current sensor which is configured to sense a current flowing in the electrical path between the line input terminal and the load output terminal, and detect a fault condition, wherein the fault condition comprises one of a short-circuit fault condition, an over-current fault condition, an arc-fault condition, and a ground-fault condition.

9. The circuit interrupter of claim 7, wherein the sensor circuit comprises an environmental sensor circuit which is configured to sense a hazardous environmental condition.

10. The circuit interrupter of claim 9, wherein the environmental sensor circuit comprises one or more of (i) a chemical sensitive detector that is configured to detect a presence of hazardous chemicals, (ii) a gas sensitive detector that is configured to detect a presence of hazardous gases, (iii) a temperature sensor that is configured to detect a temperature, (iv) a piezoelectric detector that is configured to detect vibrations; and (v) a humidity sensor that is configured to detect a damp environment.

11. The circuit interrupter of claim 7, wherein the second control switch comprises a phototransistor and wherein the sensor circuit is optically coupled to the phototransistor such that the phototransistor is activated in response to optical control signals.

12. The circuit interrupter of claim 6, wherein the second control switch comprises a phototransistor and wherein the phototransistor is activated in response to optical control signals.

13. An electrical circuit breaker comprising the circuit interrupter of claim 1.

14. An electrical receptacle device comprising the circuit interrupter of claim 1.

15. An electrical light switch comprising the circuit interrupter of claim 1.

16. A circuit interrupter, comprising:
a solid-state switch serially connected between a line input terminal and a load output terminal of the circuit interrupter, and configured to be placed in one of (i) a switched-on state to provide an electrical connection in an electrical path between the line input terminal and the load output terminal, and (ii) a switched-off state; and
a mode control circuit configured to implement a first control mode and a second control mode to control operation of the circuit interrupter;
wherein the first control mode is configured to generate a self-bias turn-on threshold voltage for the solid-state switch during power-up of the circuit interrupter, while maintaining the solid-state switch in the switched-off state until the self-bias turn-on threshold voltage is generated; and
wherein the second control mode is configured to disrupt the self-bias turn-on threshold voltage and place the solid-state switch into the switched-off state;
wherein the mode control circuit comprises:
a self-biasing circuit comprising a voltage clamping circuit and a first control switch;
wherein the voltage clamping circuit is configured to generate the self-bias turn-on threshold voltage for the solid-state switch during power-up of the circuit interrupter using current drawn from an input power source applied to the line input terminal of the circuit interrupter; and
wherein the first control switch is configured to short a control input of the solid-state switch to maintain the solid-state switch in a switched-off state until the self-bias turn-on threshold voltage is generated.

17. The circuit interrupter of claim 16, wherein the voltage clamping circuit comprises a capacitor and a Zener diode connected in parallel.

18. The circuit interrupter of claim 16, wherein the self-biasing circuit comprises a resistor-capacitor (RC) network coupled to a control terminal of the first control switch, wherein the RC network is charged during the power-up of the circuit interrupter using current drawn from the input power source applied to the line input terminal of the circuit interrupter, wherein the RC network is configured to have an RC time constant which corresponds to a time period that is not less than a time period needed to generate the self-bias turn-on threshold for the solid-state switch during power-up of the circuit interrupter.

19. The circuit interrupter of claim 16, wherein the self-biasing circuit comprises an operational amplifier having an input connected to the voltage clamping circuit and an output connected to a control terminal of the first control switch, wherein the operational amplifier is configured to control operation of the first control switch by maintaining the first control switch in a switched-on state during generation of the self-bias turn-on threshold voltage, and placing the first control switch into a switched-off state after the self-bias turn-on threshold voltage is generated.

20. The circuit interrupter of claim 16, wherein:
the mode control circuit comprises a second control switch which is configured to short the control input of the solid-state switch and disrupt the self-bias turn-on threshold voltage to place the solid-state switch into a switched-off state, in response to activation of the second control switch; and
the circuit interrupter further comprises a sensor circuit which is configured to generate a control signal to activate the second control switch in response to the sensor circuit detecting a condition that warrants placing the solid-state switch into the switched-off state.

* * * * *